United States Patent [19]
Kimura et al.

[11] Patent Number: 5,299,165
[45] Date of Patent: Mar. 29, 1994

[54] SEMICONDUCTOR MEMORY HAVING ONE-TRANSISTOR/ONE-CAPACITOR MEMORY CELLS AND HAVING BOTH IMPROVED NOISE RATIO AND HIGH DENSITY INTEGRATION

[75] Inventors: Katsutaka Kimura, Akishima; Takeshi Sakata, Kunitachi; Kiyoo Itoh, Higashikurume, all of Japan

[73] Assignee: Hitachi, Ltd, Tokyo, Japan

[21] Appl. No.: 775,001

[22] Filed: Oct. 11, 1991

[30] Foreign Application Priority Data

Oct. 17, 1990 [JP] Japan .................................. 2-276293
Nov. 28, 1990 [JP] Japan .................................. 2-322967

[51] Int. Cl.$^5$ .......................... G11C 11/34; G11C 7/00
[52] U.S. Cl. ...................................... 365/210; 365/185
[58] Field of Search ................................. 365/210, 185

[56] References Cited
U.S. PATENT DOCUMENTS 4,363,111 12/1982 Heightley et al. .................. 365/210
4,641,284  2/1987 Suzuki .............................. 365/210
4,972,378 11/1990 Kitagawa et al. .................. 365/185

FOREIGN PATENT DOCUMENTS 2-12692  1/1990  Japan .

Primary Examiner—Eugene R. LaRoche
Assistant Examiner—Viet Q. Nguyen
Attorney, Agent, or Firm—Antonelli, Terry, Stout & Kraus

[57] ABSTRACT

In a semiconductor memory, a dummy data line having dummy cells connected thereto for producing reference signals is provided in common to a plurality of data lines having memory cells connected thereto. The dummy cells and the memory cells are selected by a same word line. Each of the data lines and the dummy data line are provided with signal transfer circuitries. A differential signal detecting circuit provided for each of the lines is supplied as input thereto with an output of the signal transfer circuit together with an output of the signal transfer circuit of the dummy data line for signal detection. By connecting the dummy cell to the dummy data line provided in common to the word line to which a same signal as that for the memory cell is applied, noise transmitted to the data line and the dummy data line can be canceled out. High density integration comparable to that of an open data line arrangement and a high S/N ratio comparable to that of a folded data line arrangement can be realized.

19 Claims, 20 Drawing Sheets

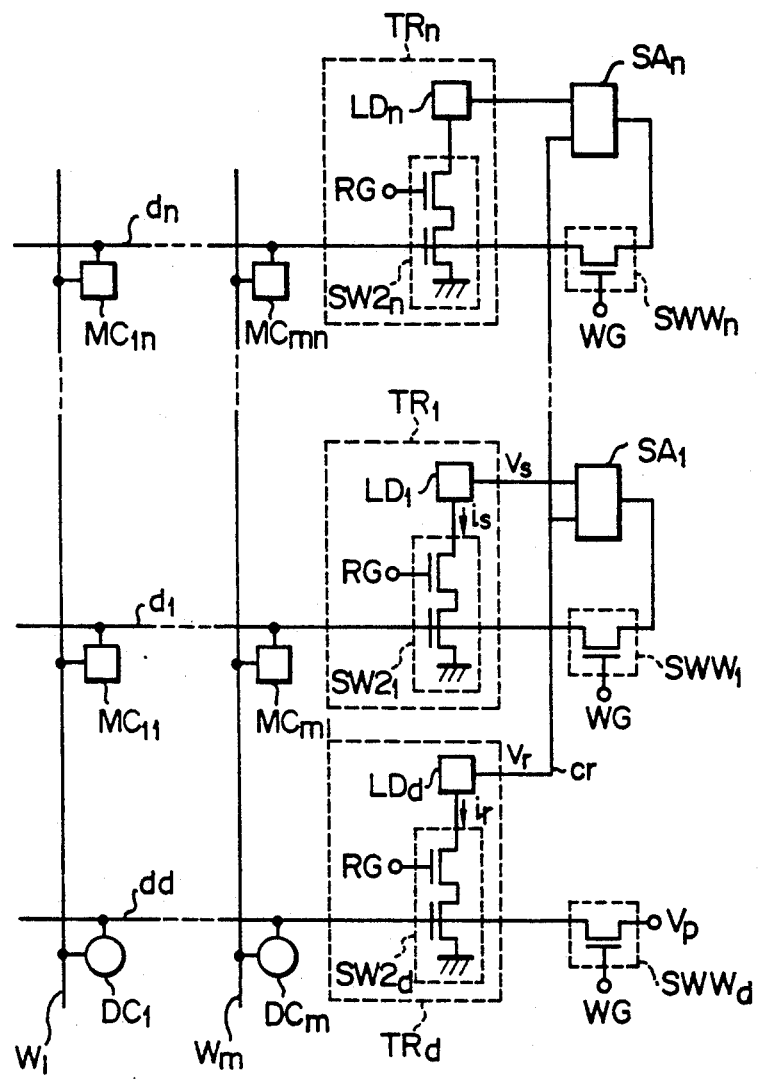
F I G. 1

| Q3 | Q2 | Q1 | P4 | P3 | P2 | P1 | |
|----|----|----|----|----|----|----|----|
| 1 | 1 | 1 | 0 | 0 | 0 | 0 | V4 |
| 0 | 1 | 1 | 1 | 1 | 0 | 0 | V3 |
| 0 | 0 | 1 | 1 | 0 | 1 | 0 | V2 |
| 0 | 0 | 0 | 1 | 0 | 0 | 1 | V1 |

SEMICONDUCTOR MEMORY HAVING ONE-TRANSISTOR/ONE-CAPACITOR MEMORY CELLS AND HAVING BOTH IMPROVED NOISE RATIO AND HIGH DENSITY INTEGRATION

CROSS-REFERENCE TO RELATED APPLICATION

This application relates to U.S. Ser. No. 07/774,834 entitled "Semiconductor Memory Device" filed on Oct. 11, 1991 by Takeshi Sakata et al. and assigned to the present assignee, which is based on Japanese Patent Application No.2-270398 filed by the present assignee and the contents of which are incorporated herein by reference.

BACKGROUND OF THE INVENTION

The present invention relates generally to a semiconductor memory. More particularly, the invention is concerned with a semiconductor memory which is capable of operating with a high S/N ratio and which is suited, preferably, for a high density integration.

The invention is also concerned with a semiconductor multiple-level storage memory which can be implemented with a high integration density and enjoy a high S/N ratio.

In recent years, great emphasis has been towards implementation of integrated semiconductor memories with higher and higher density. Among others, the semiconductor memory including memory cells each composed of one transistor and one capacitor (hereinafter referred to as the one-transistor/one-capacitor memory cell) is suited for integration with a high density because of a relatively small number of the elements constituting the memory cell. This type of high-density integrated semiconductor memory is implemented with memory array configurations which can generally be classified as that of a folded data-line arrangement and an open data-line arrangement, as is described in IEEE Proceedings Part I, Vol 130, No. 3, pp. 127-135 (June 1983). In the folded data-line arrangement, paired data lines, i.e. an intrinsic data line onto which a signal is read out from the memory cell and a data line onto which a reference signal is read out are disposed closely adjacent to each other. By virtue of this arrangement, noise transferred from one and the same word line can be canceled out by the paired data lines. Thus, it is possible to read out even very small or minute signals from the memory cells with a high S/N ratio, ensuring a stable operation of the integrated semiconductor memory. On the other hand, in the case of the open data-line arrangement, the data lines in a pair belong to distinct memory arrays, respectively, with a sense amplifier being disposed therebetween. Consequently, difficulty is encountered in canceling out noise generated within the memory array by the paired data lines. Thus, the open data-line arrangement is inferior to the folded data-line arrangement in respect to the S/N ratio. However, with the open data-line arrangement, it is possible to dispose the memory cells at all of the cross-points or intersections between the data lines and the word lines without omission, whereby the semiconductor memory can be integrated with an increased density. By way of example, with a memory cell structure described in 1986 IEEE ISSCC Digest of Technical Papers, pp. 268-269, in which memory cells are implemented in a groove-like fashion at the cross-points between the word lines and the data lines, integration with high density can be realized.

As will be understood from the above description, although the folded data-line arrangement is excellent in respect to the S/N ratio, it is unsatisfactory in respect to high density implementation of the memory cells because the memory cell can be disposed only at one of the intersections between the paired data lines and the word line. An approach tackling this problem is disclosed in JP-A-58-18715. However, with this known technique, it is impossible to realize the semiconductor multiple-level storage memory by using the one-transistor/one-capacitor memory cells.

At present, a multiple-level storage memory has been proposed as a memory of a large storage capacity and a low power consumption. For taking into consideration such multiple-level storage memory as well, it is contemplated with the present invention to provide also a method of realizing a multiple-level storage memory array. In the conventional semiconductor memory, one digit binary data (one bit data) is stored in one memory cell in terms of either one of two potential levels, i.e. a high potential level or a low potential level. In contrast, the semiconductor multiple-level storage memory is designed to store multiple-level voltages in memory cells for thereby making it possible to store data of plural bits. With this arrangement, the memory storage capacity can significantly be increased. More specifically, quantities of electric charges to be stored in memory cells are classified into m ($\geq 3$) levels, wherein detection is made to which one of m levels the quantity of electric charge stored in a memory cell belongs. In order to discriminatively identify the data of m levels from one another, it is necessary to detect between which of $(m-1)$ boundaries indicating the levels of the stored charges the quantity of charge as read out lies.

In JP-A-55-14588, for example, there is disclosed a detection method, which will be described below. FIG. 9 of the accompanying drawings shows a circuit disclosed in the above publication for performing the discriminative detection or identification of four-level data. Referring to the figure, a memory cell MC is composed of one capacitor and one MOS transistor, wherein the MOS transistor is driven by a word line W to output the data onto a data line d to which there are connected three sense amplifiers $SA_i$ (i=1, 2, 3). Upon occurrence of a read operation, the data line d is precharged to a potential VDD with input/output lines $DQ_i$ being precharged to reference potentials $VR_i$ ($VR_1 < VR_2 - VR_3$) for comparison in the precharge cycle. The reference potentials $VR_1$, $VR_2$ and $VR_3$ correspond to three charge boundaries for identifying discriminatively the four data. Upon completion of the precharge cycle with a control signal $\phi_A$ assuming a low level "L", the word line W is set to a high level "H", whereby data is read out from the memory cell MC, resulting in a lowering somewhat of the level on the data line. It is then determined whether the potential on the data line d is lower than the reference potential $VR_1$ or lies between the reference potentials $VR_1$ and $VR_2$ or between $VR_2$ and $VR_3$ or higher than the reference potential $VR_3$ in correspondence to the quantity of charge stored in the memory cell MC. Subsequently, the sense circuits $SA_i$ are disconnected from the data line d and the input/output lines $DQ_i$ by setting control signals $\phi_B$ and $\phi_D$ to level "L" while $\phi_C$ is being set to "H" to thereby allow the sense circuits $SA_i$ to operate. After the individual sense circuits $SA_i$ have been stabilized, the control signal $\phi_A$ is again set to "H", as a result of which the input/output lines $DQ_i$ assume "H" or "L" level in dependence on the states of the sense amplifiers $SA_i$.

The semiconductor multiple-level storage memory known heretofore suffers from problems mentioned below. The reference voltages $VR_i$ are supplied by precharging externally of the memory array. In conjunction with this, there is employed as the sense circuit a differential amplifier, the reference voltage of which is set at a fixed level. Consequently, influence of noise components contained only in the signal voltage making appearance on the data line can not be eliminated. In U.S. Pat. No. 3,705,391, there is disclosed a scheme according to which the reference voltage mentioned above is derived by converting a digital signal to an analogue signal by using a resistance ladder network. However, in the case of this known arrangement, the reference voltage remains at a fixed level as well, and thus no noise components appearing on the data line can be eliminated.

In order to invalidate the influence of noise making appearance on the data line, it is required to superpose similar noise components on the reference voltage. To this end, a dummy data line has to be disposed in the vicinity of the data line d to thereby generate the reference voltage by using the dummy data line. However, discriminative detection of m levels requires (m−1) reference voltages. Accordingly, provision of the dummy data lines for the m levels, respectively, will increase the area required for disposition of these dummy data lines which, in turn, means that the very object of the semiconductor multiple-level storage memory, that is to increase the memory capacity, can not be attained.

As a memory array in which dummy data lines are employed without being accompanied with any appreciable increase in the area therefor, there is known a semiconductor multiple-level storage memory capable of storing four levels in a memory cell, which is discussed, for example, in IEEE 1988 CUSTOM INTEGRATED CIRCUITS CONFERENCE, Digest of Technical Papers, pp. 4.4.1–4.4.4. According to the teaching disclosed in this publication, one of paired data lines is used as the data line onto which charge is read out from the memory cell while the other one is used as the dummy data line onto which charge is placed from a dummy cell. However, operations for the data line and the dummy data line differ from each other, and it is required to divide the dummy data line upon occurrence of a read operation. Such being the circumstances, difference in the noise components is produced between the signal voltage on the data line and the reference signal volt e on the dummy data line. Such difference in noise cannot be eliminated by the sense amplifier. Thus, limitation is necessarily imposed to the attempt for realizing a high S/N ratio.

SUMMARY OF THE INVENTION

With the present invention, it is contemplated to solve the problems of the prior art semiconductor memories described above.

In view of this, there is provided according to an aspect of the invention a semiconductor memory device which comprises a plurality of word lines, a plurality of data lines disposed to intersect the word lines, a plurality of memory cells disposed at given ones of the crosspoints or intersections between the word lines and the data lines, and a dummy data line commonly provided for the plural data lines and having a plurality of dummy cells connected thereto for producing reference signals, wherein the dummy cells are connected to the word line to which a same signal as that for the memory cell is applied. Each of the data lines and the dummy data line are provided with signal conversion circuits, respectively. Further, the data lines are provided with differential signal detecting circuits, respectively, each of which is supplied, at a first input thereof, with an output of an associated one of the signal conversion circuits and, at a second input thereof, with an output of the signal conversion circuit, connected to the dummy data line, for effecting a signal detecting operation.

Further, the problems from which the multiple-level storage memory discussed heretofore, suffers can be solved by such arrangement that a pair of dummy data lines having dummy cells connected thereto are disposed in parallel with the data lines to which multiple-level sense circuits and multiple-level supply circuits are connected, wherein a multiple-level sense circuit is connected to the dummy line as well. By comparing the signal read out from the memory cell onto the data line with reference levels obtained by multiplying the signals read out onto the two dummy data lines from the dummy cells with constants, respectively, and adding the products resulting from the multiplications by the abovementioned multiple level sense circuit, there can be identified discriminatively to which of the three or more reference levels the data stored in the abovementioned memory cell corresponds.

More specifically, from a plurality of memory cells connected to a selected one of the word lines, signals are simultaneously read out onto the associated data lines, respectively, while the reference signal is read out onto the dummy data line from the dummy cell. The signals on the respective data lines are inputted to the signal conversion circuits provided for the data lines, respectively, which produce output signals corresponding to the signals read out onto the data lines, respectively. Similarly, the reference signal on the dummy data line is inputted to the signal conversion circuit connected to the dummy data line, whereby an output signal corresponding to the reference signal on the dummy line is produced by the signal conversion circuit mentioned just above. Subsequently, the output signals of the signal conversion circuits provided for the intrinsic data lines are inputted to differential signal detecting circuits provided for these data lines, respectively, while the output signal of the signal conversion circuit connected to the dummy data line is inputted in common to the differential signal detecting circuits provided for the data lines, respectively, which circuits then detect the signals originating in the memory cells by using the reference signal inputted in common. In this manner, the signals read out onto the data lines from the memory cell can be detected by using the reference signal read out onto the dummy data line provided in common to a plurality of data lines. To say in another way, the data line provided in a pair with each of the data line in the memory array known heretofore, i.e. the data line onto which the reference signal is read out is provided in common to a plurality of the intrinsic data lines. Thus, it is possible to dispose the memory cells at all the intersections between the word lines and the data lines, whereby disposition of the memory cells with a higher density can be realized. Further, by connecting the dummy cell connected to the dummy data line provided in common to the same word line to which the same signal as that for the memory cell is applied, it is possible to cancel out noise components transmitted to the data line and the dummy data line. In this way, a high S/N ratio comparable to that of the folded data-line arrangement can be achieved. As will now be understood, there is thus provided according to the invention a semiconductor memory of high integration density and high S/N ratio.

Next, in the semiconductor multiple-level storage memory, a read operation is performed in a manner described below. At first, given memory cells are selected by the word lines, whereby signals of multiple levels are read out onto the data lines. At the same time, reference signals are read out from the dummy cells onto two dummy data lines. These signals are inputted to the multiple level sense circuits connected to the data lines. By weighting the two reference signals through multiplication with constants and determining the sum of the products resulting from the multiplication, there can be generated different reference levels for comparison. Namely, by using the weighting coefficients of different values, three or more reference levels for comparison can be derived. These reference levels are then compared with the signals appearing on the data lines to thereby identify or detect discriminatively the signals with reference to the reference signals. The result of the detection is inputted to a multiple-level supply circuit, whereby a signal corresponding to one of the multiple levels is outputted onto the data lines for restoration of the memory cells.

The signals read out onto the data lines and the reference signal appearing on the dummy data line contain noise components, respectively. The intrinsic data line and the dummy data line are implemented in a similarly configured structure to balance the electric characteristics such as parasitic capacitance and are disposed adjacent to each other. By selecting appropriately the coefficient of product for the reference signals in deriving the reference levels for comparison, the magnitude of the noise component contained in the reference level can be made to be the same as that of the signal on the data line. In this manner, the influence of noise can be eliminated in the multiple-level sense circuit, whereby high S/N ratio can be realized.

Accordingly, it is an object of the present invention to provide a method of realizing a memory array which makes it possible to dispose one-transistor/one-capacitor memory cells in an open data-line arrangement permitting a high density integration while assuring a high S/N ratio comparable to that attainable with the folded data-line arrangement.

Another object of the present invention is to provide a semiconductor multiple-level storage memory in which data of multiple levels read out from memory cells can discriminatively be identified or detected with high S/N ratio while eliminating noise components contained in a signal without involving any appreciable increase in chip area.

These objects and many of the attendant advantages of this invention will become better understood by reference to the following detailed description when considered in connection with the accompanying drawings.

BRIEF DESCRIPTION OF THE DRAWINGS

FIG. 1 shows an arrangement of a memory array for semiconductor memory according to a first embodiment of the present invention;

DESCRIPTION OF THE PREFERRED EMBODIMENTS

Figure 2:
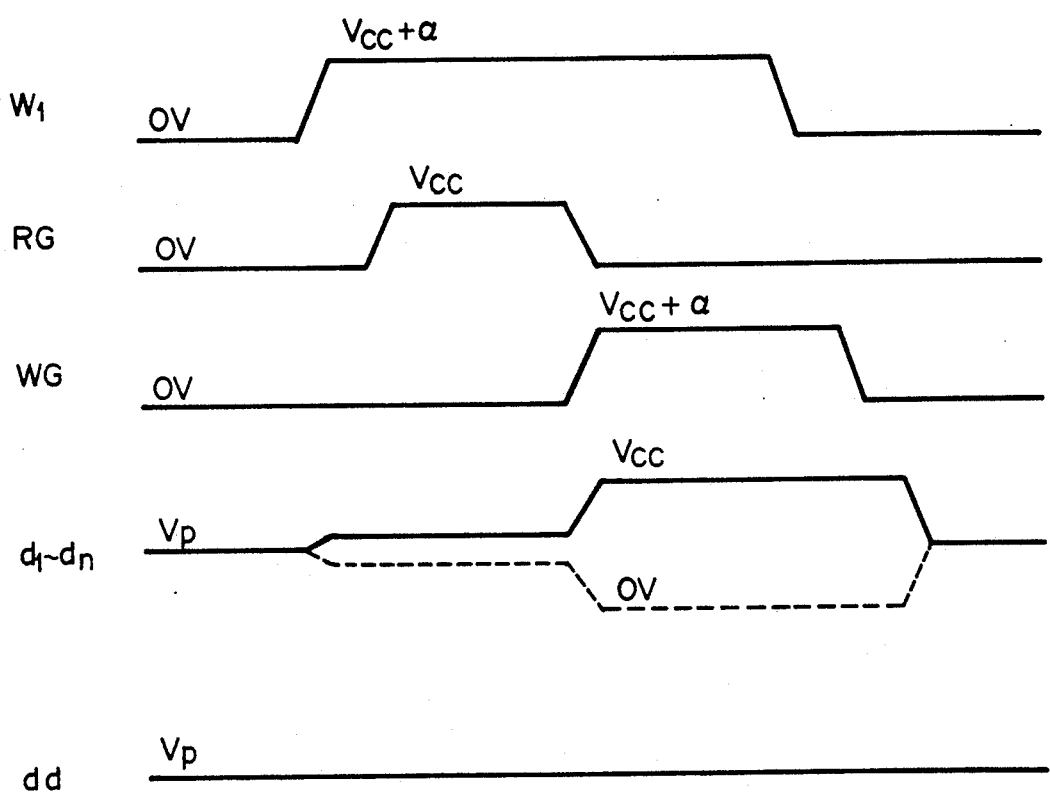
FIG. 2 is a timing chart for illustrating operation of the memory array shown in FIG. 1.

The present invention will now be described in conjunction with preferred or exemplary embodiments by reference to the drawings.

FIRST EMBODIMENT

For convenience of description which follows, nomenclatures used herein are first shown below together with meanings thereof.

MC, MC$_{11}$, MC$_{mn}$: memory cell
DC, DC$_1$, DC$_m$: dummy cell
W$_1$, W$_m$, W: word line
DW: dummy word line
d, d$_1$, d$_n$: data line
dd: dummy data line
TR$_1$, TR$_n$, TR$_d$: signal converter
SW2$_1$, SW2$_n$, SW2$_d$: voltage-to-current converter
LD$_1$, LD$_n$, LD$_d$: current-to-voltage converter
SWW$_1$, SWW$_n$, SWW$_d$: switch circuitry
SA$_1$, SA$_n$, SA$_d$: differential sense circuit
cd, cd$_1$, cd$_n$: global data line
cdd: global dummy data line
MCA: memory cell array
DCA: dummy cell array
DQ: input/output line
MLR: multiple-level sense circuit
MLW: multiple-level supply circuit
DS: signal transfer circuitry
PD: precharge circuit FIG. 1 shows a memory array of a semiconductor memory device according to a first embodiment of the invention. Referring to the figure, memory cells MC$_{11}$, ..., MC$_{mn}$ (generally denoted by MC) are disposed at cross-points or intersections between word lines W$_1$, ..., W$_m$ and data lines d$_1$, ..., d$_n$, respectively, in a matrix-like array. Dummy cells DC$_1$, ..., DC$_m$ are provided separately from the data lines to which the memory cells MC are connected. A data line to which only the dummy cell is connected, i.e. the dummy data line dd is provided in common to a plurality of the data lines. The dummy cell is connected to the same word line W as the memory cell. At this juncture, it should be mentioned that the dummy data line dd is to serve for reading a reference signal from the dummy cell for detection of a signal from the memory cell read out onto the data line, as will be described in more detail later on. For the purpose of canceling out noise occurring upon read operation, the dummy data line should be implemented such that electric characteristics thereof such as parasitic capacitance and others be balanced with those of the data line. Further, the dummy cell W should be so designed as to output onto the dummy data line dd a voltage substantially of a middle level intermediate the voltage levels which are stored in the memory cells and representing signal or data of "1" and "0", respectively. Concrete examples of arrangement of the dummy data line and the dummy cell will be described later on.

Signal converters TR$_1$, ..., TR$_n$ and TR$_d$ (generally denoted by TR) are provided for the individual data lines and the dummy data line, respectively. In the case of the embodiment shown in FIG. 1, each of the signal converters TR (TR$_1$, ..., TR$_n$ and TR$_d$) is composed of a voltage-to-current converion circuitry SW2 (SW2$_1$, ..SW2$_n$ and SW2$_d$) and a current-to-voltage conversion circuitry LD (LD$_1$, ..., LD$_n$ and LD$_d$). Each of the voltage-to-current conversion circuitries SW2 is shown as being composed of a pair of MOS transistors connected in series, by way of example. Applied to a gate of one of the MOS transistors is a control signal RG for the voltage-to-current conversion circuitry SW2, while the gate of the other MOS transistor is connected to the data line or the dummy data line. The current-to-voltage conversion circuitry LD has a function to convert a signal current outputted from the voltage-to-current converion circuitry SW2 into a signal voltage. This function can be realized by employing a resistor or a MOS transistor, as will hereinafter be described. By virtue of the provision of the signal converters TR mentioned above, it is possible to isolate the parasitic capacitance of the data lines as well as the dummy data line from that of the differential sense circuits described below, as a result of which a high S/N ratio can be realized even when the capacitance of a storage capacitor is selected small. The differential sense circuitries SA$_1$, ... SA$_n$ (generally denoted by SA) are provided for the data lines d$_1$, ..., d$_n$, respectively. Each of the differential sense circuitries SA has one input terminal connected to the output terminal of each of the signal converters TR (TR$_1$, ..., TR$_n$) provided for the data lines, respectively. The other input terminal of the differential sense circuitry SA is connected to the output terminal of the signal converter TR$_d$ provided for the dummy data line dd by way of a global reference signal line cr. Each of switches SWW$_1$, ... SWW$_n$ (generally denoted by SWW) serves for rewriting or restoring data in the associated memory cell by utilizing the detection output of the differential sense circuit SA. These switches SWW are provided for the data lines d$_1$, ... d$_n$, respectively, and each controlled by a control signal WG. It should however be noted that the switch SWW$_d$ provided for the dummy data line dd is to serve for balancing the electric characteristics of the dummy data line with those of the data lines.

Now, description will be directed to a read operation in the memory array of the structure described above by reference to FIG. 2. The individual data lines d$_1$, ..., d$_n$ and the dummy data line dd are precharged to a given potential V$_p$ previously according to a method which will be described later on. Next, one of the word lines, e.g. the word line W$_1$ is selected, as a result of which there are simultaneously read out signals on the individual data lines d$_1$, ..., d$_n$ from the memory cells connected to the selected word line W$_1$. At the same time, a reference signal is read out onto the dummy data line dd from the dummy cell connected to this word line W$_1$. This reference signal is set approximately at an intermediate or middle level between the two voltage levels appearing on the data lines when data of "1" and "0" stored in the memory cells are read out, respectively. The signals read out onto the individual data lines d and the reference signal read out onto the dummy line dd are inputted to the associated signal converters TR (TR$_1$, ..., TR$_n$, TR$_d$), respectively. Thereafter, the control signal RG for the respective voltage-to-current conversion circuitries SW2 (SW2$_1$, ..., SW2$_n$ and SW2$_d$) is set to a high potential to put into operation these voltage-to-current conversion circuitries SW2. As a result of this, the data or signal currents is and the reference signal current ir flow to the ground potential from the respective current-to-voltage conversion circuitries LD (LD$_1$, ..., LD$_n$ and LD$_d$) through the voltage-to-current conversion circuitries SW2 (SW2$_1$, ..., SW2$_n$ and SW2$_d$) in dependence on the signals and the reference signal read out onto the data lines and the dummy data line from the memory cells and the dummy cell, respectively. The value of the signal current is as well as that of the reference signal current ir is determined in accordance with the signal voltage read out onto the data line and the dummy data line, respectively. The signal voltage is converted to the signal current. The signals from the memory cells and the reference signal from the dummy cell which are in the form of the signal currents resulting from the above-mentioned voltage-to-current conversion are again converted into signal voltages by the current-to-voltage conversion circuitries LD (LD$_1$, ..., LD$_n$ and LD$_d$), respectively. These signal voltages are then inputted to the differential sense circuitries SA (SA$_1$, ..., SA$_n$). More specifically, the signal voltages vs obtained from every data line are applied to one inputs of the respective differential sense circuits SA. On the other hand, the reference signal voltage Vr outputted from the current-to-voltage converter LD$_d$ provided in association with the dummy data line is inputted in common to other input terminals of the differential sense circuits SA$_1$, ..., SA$_n$ via the global reference signal line cr. Thus, the differential sense circuits SA$_1$, ..., SA$_n$ detect discriminatively the signal voltages supplied from the data lines with the aid of the reference signal voltage vr inputted in common.

In the one-transistor/one-capacitor memory cell, reading of the stored data is effected destructively, necessitating data rewriting or restoration. Accordingly, restoring operation is performed to the memory cells on the basis of the detection outputs from the differential sense circuits SA. To this end, the switches SWW (SWW$_1$, ..., SWW$_n$) are turned on by the control signal WG, whereby data for restoration of the memory cells are transferred to the respective data lines. As a result, the data are rewritten or restored in the memory cells, which is completed by setting the word line to the unselected state.

As will be understood from the above, according to the instant embodiment of the invention, the signals read out from the memory cells onto the data lines can be detected with the aid of the reference signal read out onto the dummy line provided in common to the plural data lines. To say in another way, the data line which has heretofore been provided in a pair with each of the data lines and onto which the reference signal is read out can now be provided in common to a plurality of the data lines according to the teaching of the invention incarnated in the illustrated embodiment. Thus, it is now possible to dispose the memory cells at all the intersections between the word lines and the data lines, whereby high density implementation of the memory cells can be achieved. Further, by connecting the data lines and the dummy data line to the differential sense circuits SA through the medium of the signal converters TR, respectively, there can be realized isolation in the parasitic capacitance between the data lines and the dummy data line on one hand and the differential sense circuits on the other hand, which in turn means that a high S/N ratio can be obtained even when the capacity of the capacitor of the memory cell is reduced, whereby the high density integration of the memory array can further be enhanced. Besides, by virtue of the isolation with respect to the parasitic capacitance mentioned above, it is possible to balance satisfactorily the electric characteristics such as the parasitic capacitance and others of the dummy line with those of the data lines notwithstanding of the provision of the dummy data line in common to a plurality of data lines. In addition, owing to such arrangement that the dummy cell connected to the dummy line provided in common as mentioned above is connected to the word lines to which the same signal as that for the memory cells is applied, it is possible to cancel out noise which would otherwise be transmitted to the data lines and the dummy data line. Thus, read operation can be effectuated with a high S/N ratio which is comparable to that of the folded-data line arrangement. As will now be apparent, there can thus be implemented an improved structure of semiconductor memory which can enjoy a high density integration assure a high S/N ratio.

SECOND EMBODIMENT

Figure 3:
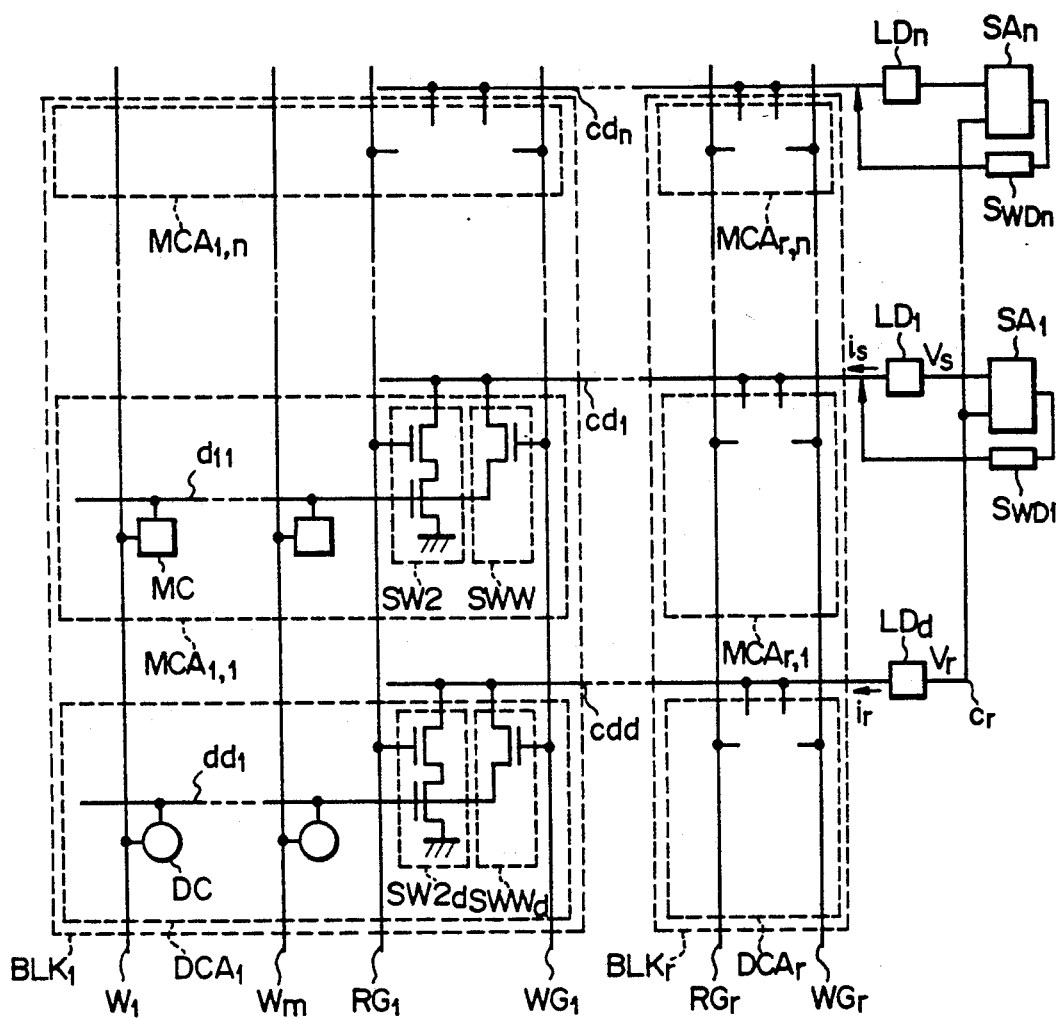
FIG. 3 shows a memory array according to a second embodiment of the invention.

FIG. 3 shows a memory array according to a second embodiment of the invention which differs from the memory array shown in FIG. 1 in that a circuit portion including the memory cells MC, the dummy cells DC, the data lines d, the dummy data line dd, the voltage-to-current converters SW2 and the switches SWW are incorporated in a block BLK, wherein differential sense circuits SA and the current-to-voltage converters LD are provided in common to the individual blocks BLK. In the case of the embodiment shown in FIG. 3, it is assumed that the differential sense circuits SA and the current-to-voltage converters LD are provided in common to r blocks BLK$_1$, ..., BLK$_r$, wherein each of these blocks is constituted by a plurality of memory cell blocks MCA$_{1,1}$, ..., MCA$_{1,n}$ (generally denoted by MCA) and a dummy cell block DCA, wherein each of the memory cell blocks MCA is composed of memory cells MC, a data line d, a voltage-to-current converter SW2 and a switch SWW, while the dummy cell block DCA is composed of dummy cells DC, a dummy data line dd, a voltage-to-current converter SW2$_d$ and a switch SWW$_d$.

Read operation in the memory array shown in FIG. 3 is carried out in a manner described below. At first, one of the plural word lines, for example, the word line W$_1$ of the memory cell blocks MCA$_{1,1}$, ..., MCA$_{1,n}$ is selected, as a result of which there make appearance simultaneously signals on the individual data lines (e.g. d$_{11}$ and others) of the memory cell blocks MCA$_{1,1}$, ..., MCA$_{1,n}$ from the memory cells connected to the word line W$_1$. At the same time, a reference signal is read out onto the dummy data line dd$_1$ of the dummy cell block DCA$_1$ from the dummy cell DC connected to the word line W$_1$. The signals read out onto the individual data lines d and the reference signal read out onto the dummy line dd are inputted to the voltage-to-current converters SW2 and SW2$_d$ incorporated in the memory cell blocks and the dummy cell block, respectively. Thereafter, the control signal RG$_1$ for the voltage-to-current converters SW2 and SW2$_d$ is set to a high potential. As a consequence, data or signal currents is and the reference signal current ir flow to the ground potential from the associated current-to-voltage converters LD (LD$_1$, ..., LD$_n$ and LD$_d$) through the common data lines cd (cd$_1$, ..., cd$_n$) and the voltage-to-current converters SW2 and through the common dummy data line cd$_d$ and the voltage-to-current converter SW2$_d$, respectively, in dependence on the data signals read out onto the data lines from the memory cells and the reference signal read out onto the dummy data line, respectively. These signal currents are again converted to the signal voltages through the respective current-to-voltage converters LD (LD$_1$, ..., LD$_n$ and LD$_d$). The signal voltages are then inputted to the differential sense circuits SA ($SA_1, \ldots, SA_n$). More specifically, as described hereinbefore by reference to FIG. 1, the signal voltages vs obtained from the data lines are applied to one inputs of the respective differential sense circuits SA. On the other hand, the reference signal voltage ir obtained from the dummy data line is inputted in common to other input terminals of the differential sense circuits SA ($SA_1, \ldots, SA_n$) via the global reference signal line cr. Thus, the differential sense circuit SA detect discriminatively the signal voltages supplied from the data lines with reference to the reference signal voltage vr inputted in common. In succession, restoring operation is performed for the memory cells on the basis of the detection outputs from the differential sense circuits SA. At this time point, the voltage-to-current converters SW2 and the current-to-voltage converters LD ($LD_1, \ldots, LD_n$ and $LD_d$) are in the off state. The data for restoration of the memory cells are transferred to the global data lines cd ($cd_1, \ldots, cd_n$) by turning on the write switches SWD ($SWD_1, \ldots, SWD_n$) to be inputted to the switches SWW incorporated in the memory cell blocks. The switches SWW are turned on by the control signal $WG_1$, whereby the data for restoration are written in the memory cells. The restoring operation to the individual memory cells is completed by setting the word line to the unselected state.

According to the second embodiment of the invention, there can be obtained in addition to the advantageous effects of the first embodiment such a benefit that because the differential sense circuitry and the current-to-voltage converter are shared by a plurality of the memory cell blocks, the area occupied by them can be diminished relative to the memory array shown in FIG. 1. Further, in the case of the second embodiment, connections of the data lines and the global data lines are realized by way of the voltage-to-current converters, as a result of which the parasitic capacitance of the data lines can completely be isolated from that of the global data line upon read operation. In other words, by virtue of the abovementioned sharing of the differential sense circuit and the current-to-voltage converter by the memory cell blocks, the signal voltages read out onto the data line from the memory cells are protected against the influence of the parasitic capacitance of the global data line, which in turn means that read operation can be performed with a high S/N ratio. Parenthetically, it should be added that noise due to a coupling capacity between the global data line and the individual data lines provides practically no problem because fluctuation in the voltage on the global data line brought about upon read operation is negligible.

THIRD EMBODIMENT

Figure 4:
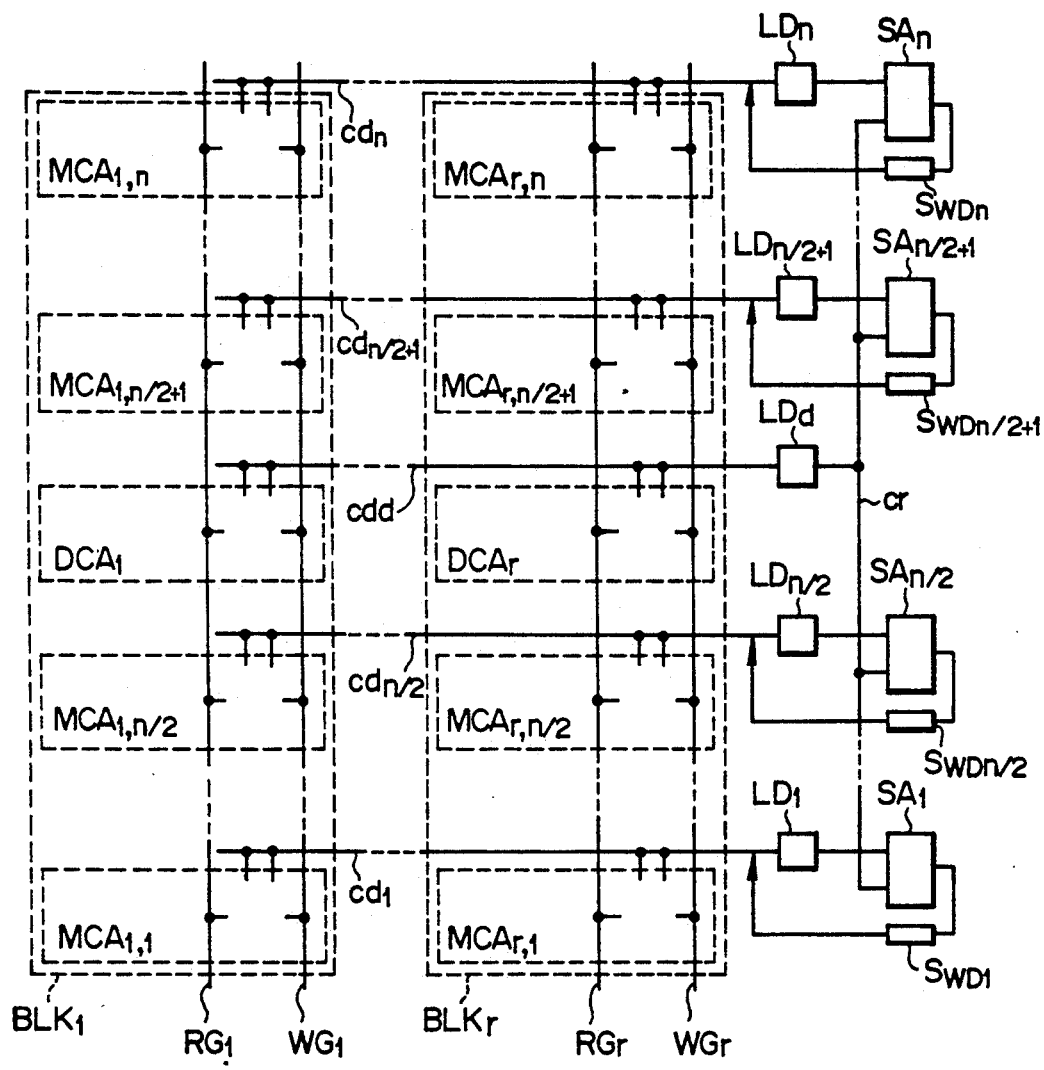
FIG. 4 shows a memory array according to a third embodiment of the invention.

FIG. 4 shows a memory array structure according to a fourth embodiments of the invention in which a dummy cell block DCA provided in common to a plurality of memory cell blocks in a memory block is interposed between the memory cell blocks. With this structure of the memory block, distance between the current-to-voltage converter $LD_d$ connected to the global dummy data line $cd_d$ and the differential sense circuit SA ($SA_1, \ldots, SA_n$) disposed at one end of the memory arrays can be shortened, whereby the length of the global reference signal line cr can be diminished to a half when compared with that of the reference signal line in the memory array shown in FIG. 3. Thus, parasitic resistance and capacitance existing between the current-to-voltage converter $LD_d$ and the differential sense circuit SA can be reduced to a half, which can also contribute to reduction of the time taken for the reference signal outputted from the current-to-voltage converter $LD_d$ to be inputted to the difference sense circuitry SA. In other words, the read operation can be speeded up. Operation of the memory array according to the third embodiment of the invention is similar to that described above by reference to FIG. 3. Accordingly, repeated description thereof will be unnecessary.

FOURTH EMBODIMENT

Figure 5:
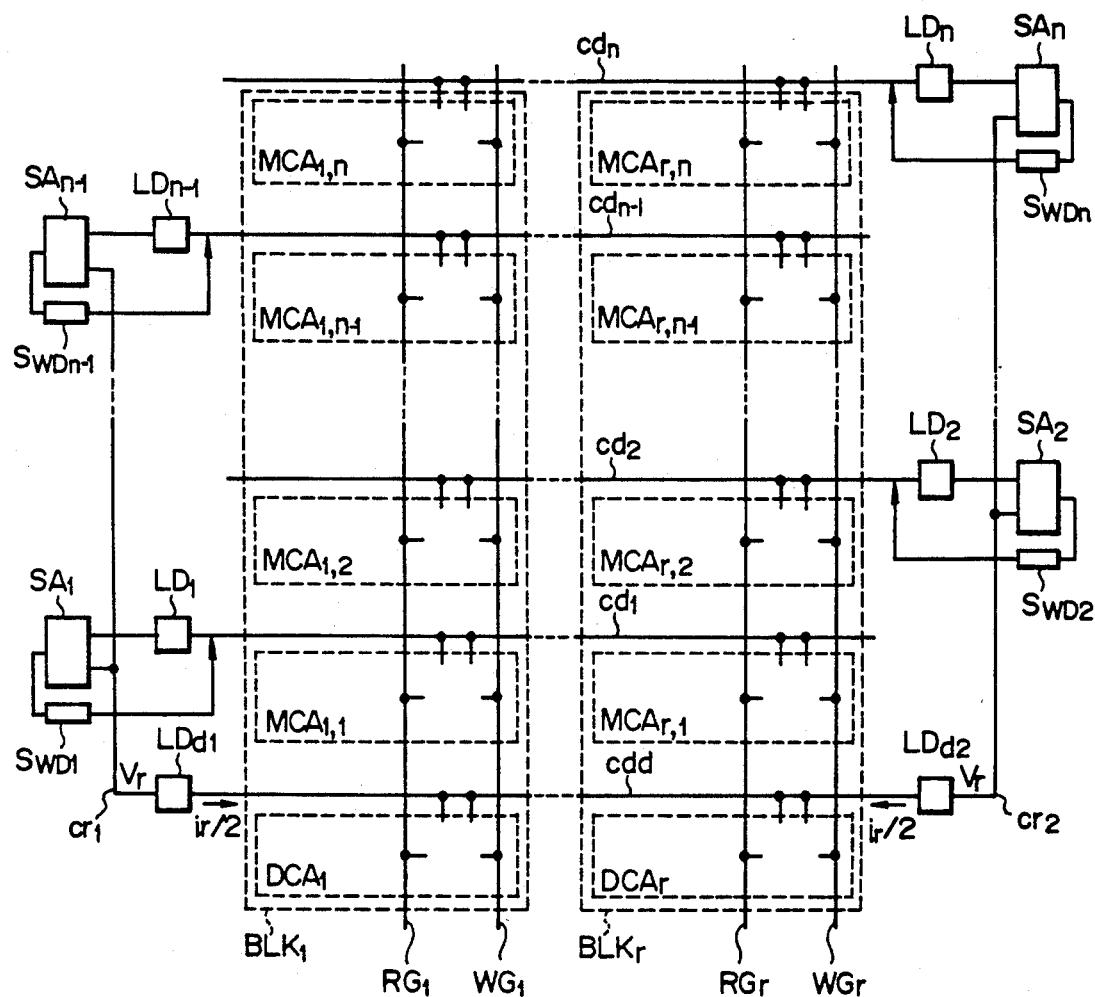
FIG. 5 shows a memory array structure according to a fourth embodiment of the invention.

FIG. 5 shows a memory array structure according to a fourth embodiment of the invention in which the differential sense circuits SA are disposed alternately at both ends of the global data lines in order to mitigate a pitch in the layout of the differential sense circuits SA. In the case of the memory array according to the instant embodiment, it is thus required that the reference signal from the dummy cell block DCA ($DCA_1, \ldots, DCA_r$) provided in common to the memory cell blocks be led out to both ends. To this end, the current-to-voltage converters $LDd_1$ and $LDd_2$ are provided at both ends of the global dummy data line $cd_d$, respectively, so that the reference signal current ir produced through the voltage-to-current conversion in the dummy cell block DCA is distributed uniformly to both the current-to-voltage converters $LDd_1$ and $LDd_2$, respectively. The reference signal voltage vr is outputted to the global reference signal lines $cr_1$ and $cr_2$ provided at both ends, respectively. For this reason, the current-to-voltage converters $LDd_1$ and $LDd_2$ have each to be so designed as to output the reference signal voltage vr on the basis of a half value of the reference signal current ir, i.e. from ir/2. This can be accomplished by setting the transresistance involved in the current-to-voltage conversion twice as large as that of the current-to-voltage converter LD ($LD_1, \ldots, LD_n$) connected to the global data line cd. More specifically, when the current-to-voltage converter ($LDd_1, \ldots, LDd_2$) is constituted by a resistor, by way of example, the resistance value is selected twice as high. Further, in case the current-to-voltage converter of concern is constituted by a MOS transistor, the channel width is reduced by a factor of $\frac{1}{2}$. According to the fourth embodiment, the layout pitch in the disposition of differential sense circuitries and the current-to-voltage converters can be mitigated or rendered more gentle, whereby the layout of these components can be much facilitated.

FIFTH EMBODIMENT

Figure 6:
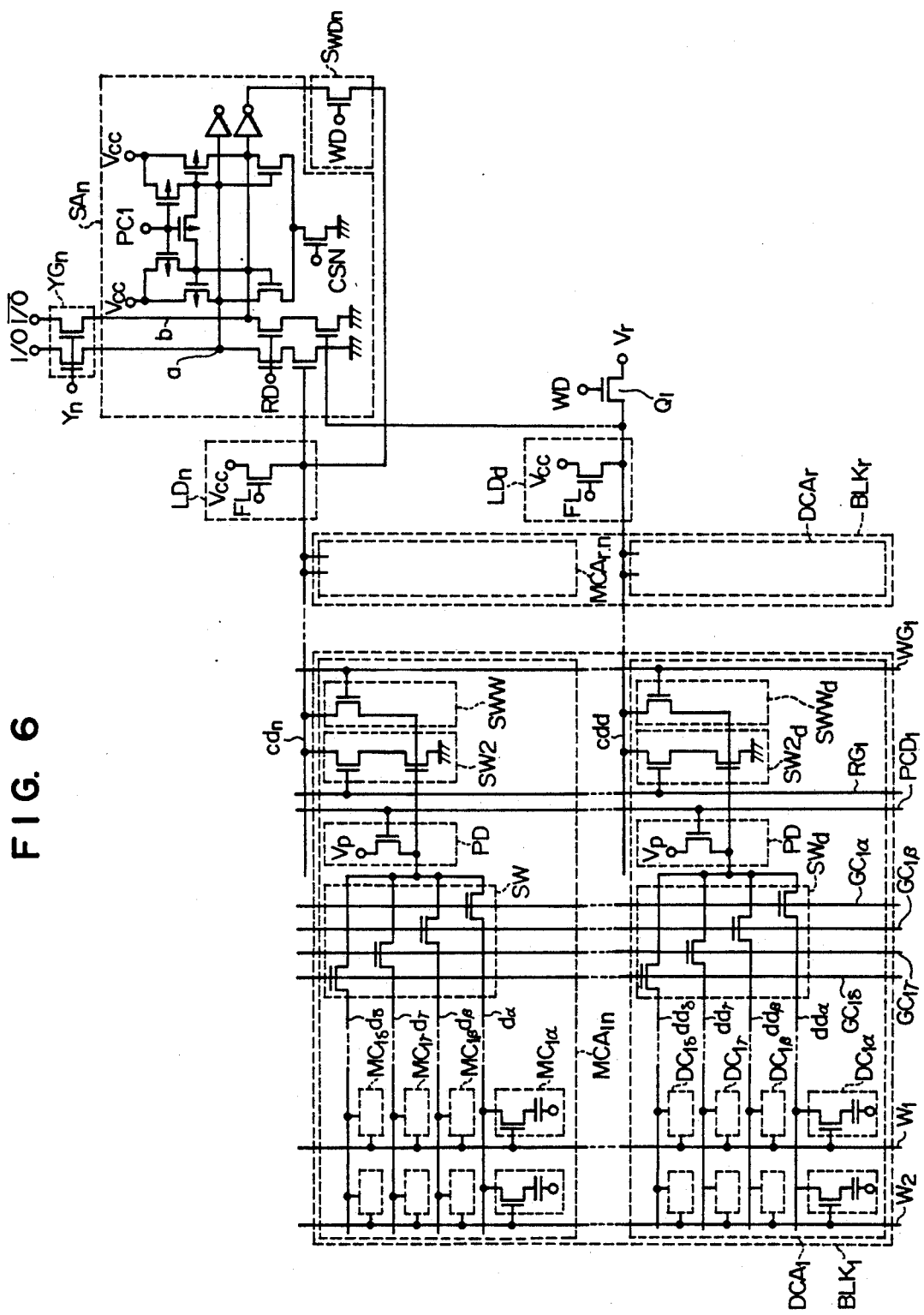
FIG. 6 shows a fifth embodiment of the memory array according to the invention.

FIG. 6 shows a fifth embodiment of the memory array according to the invention. Similarly to the structure shown in FIG. 3, the differential sense circuit SA and the current-to-voltage converter LD are provided in common to a plurality of the memory cell blocks MCA (or dummy cell blocks DCA). According to the instant embodiment, one voltage-to-current converter SW2 and one switch SWW are provided in common to a plurality of data lines d (four data lines $d_a, \ldots, d_\delta$ in the case of the array shown in FIG. 6) in each of the memory cell blocks MCA. Connection between the data line on one hand and the voltage-to-current converter SW2 and the switch SWW on the other hand is realized by using a switch element SW. Also in the dummy cell block DCA, the voltage-to-current converter $SW2_d$ and the switch $SWW_d$ are provided in common to a plurality of dummy data lines dd (four dummy data lines $dd_a, \ldots, dd_\delta$ in the case of the illustrated embodiment), wherein connection between each of the dummy data lines and the voltage-to-current converter SW2$_d$ and the switch SWW$_d$ is realized through the medium of a switch element SW$_d$. In this manner, the structure of the dummy cell block DCA can be made identical with that of the memory cell block MCA, whereby the electric characteristics of both blocks can readily be balanced with each other.

In FIG. 6, the differential sense circuit SA and the current-to-voltage converter LD are each shown as being constituted by a CMOS, by way of example.

Figure 7:
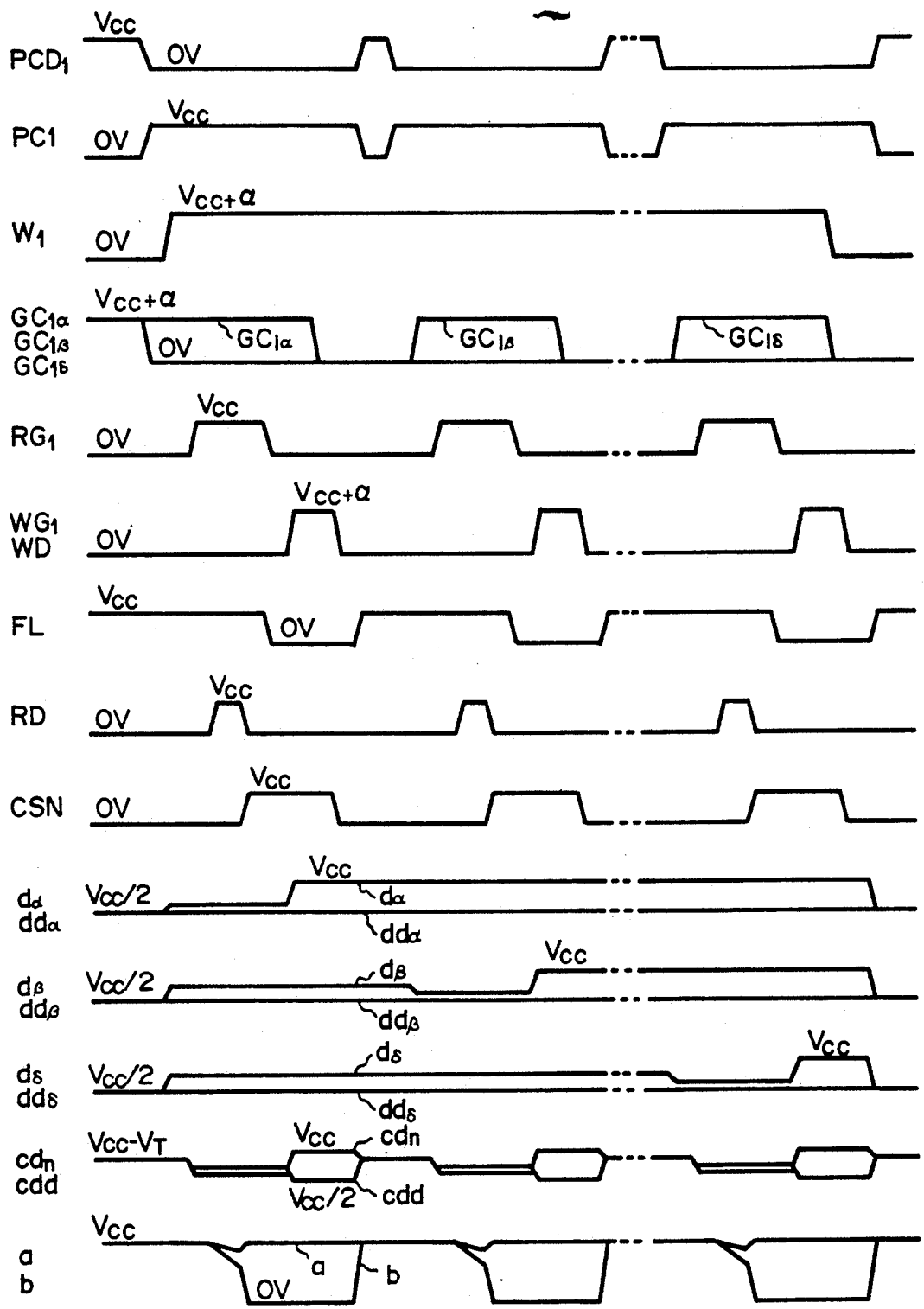
FIG. 7 is a timing chart for illustrating operation of the memory array shown in FIG. 6.

In the memory array of the structure shown in FIG. 6, a plurality of the memory cell signals read out simultaneously onto a plurality of data lines within the memory cell block in response to the selection of one word line are selected by the switch elements SW so that the memory cell signals are time-serially inputted to the voltage-to-current converter SW2, the output of which is then applied to the input of the differential sense circuitry SA for detecting time-serially the memory cell signals. Operation of the memory array according to the fifth embodiment will now be described by reference to FIG. 7 on the assumption that the individual memory cells are charged at high potential level. First, the signal PCD$_1$ as well as signals GC$_{1\alpha}$, ..., GC$_{1\delta}$ are set to a high potential, to thereby cause a precharge circuit PD to precharge the data lines d$_\alpha$, ..., d$_\delta$ and the dummy data lines dd$_\alpha$, ..., dd$_\delta$ at a given potential V$_p$ (V$_{cc}$/2 in this case, where V$_{cc}$ represents a supply voltage) through the switch elements SW and SW$_d$. Further, by setting a signal FL to a high potential, the global data line cd and the global dummy data line cd$_d$ are previously set to a constant voltages which are determined by the current-to-voltage converters LD and LD$_d$, respectively. Further, a signal PC1 is set to a lower level to thereby precharge nodes a and b of the differential sense circuit SA to the level of the supply voltage V$_{cc}$. By applying previously the constant voltage to the global data lines cd and the global dummy data line cd$_d$ in this manner, reading of the memory cell signal and the dummy cell signal can be performed at a higher speed as compared with the case where the constant voltage is set to neither the global data line cd nor the global dummy data line cd$_d$. Starting from this state, when one word line, e.g. W$_1$, is selected, the memory cell signals are read out from the memory cells connected to that word line onto the respective data lines d$_\alpha$, ..., d$_\delta$, while the reference signal is read out from the dummy cells DC onto the respective dummy data lines dd$_\alpha$, ..., dd$_\delta$. In that case, when one (e.g. GC$_{1\alpha}$ in FIG. 6) of the signals GC$_{1\alpha}$, ..., GC$_{1\delta}$ for controlling the switch elements SW (or SW$_d$) is previously set to a high potential level with the other signals being set to a low potential, only the memory cell signal read out on the data line d$_\alpha$ of those read out on the data lines d$_\alpha$, ..., d$_\delta$ is transferred to the voltage-to-current converter SW2, while the other memory cell signals read onto the remaining data lines d$_\beta$, ..., d$_\delta$ are being retained thereon. Similarly, of the reference signals read out on the dummy data lines, only the signal read out onto the dummy data line dd$_\alpha$ is transferred to the voltage-to-current converter SW2$_d$ with the other reference signals being held on the remaining dummy data lines, respectively. Subsequently, the signal RG$_1$ is set high to allow the voltage-to-current converter SW2 to operate, which results in that a current flows to the ground potential from the current-to-voltage converter LD via the voltage-to-current converter SW2. This current assumes a value corresponding to that of the voltage applied to the gate of a MOS transistor constituting the voltage-to-current converter SW2, i.e. the value corresponding to that of the memory cell signal inputted to the voltage-to-current converter SW2. This current flows through a MOS transistor constituting the the voltage-to-current converter LD as well. As a consequence, the source potential of the abovementioned MOS transistor and hence the potential of the global data line cd change in accordance with the value of the current flowing therethrough and is inputted to the differential sense circuit SA as the signal voltage. In this way, the memory cell signal read out onto the data line d$_\alpha$ is converted to the signal current by the voltage-to-current converter SW2, whereon the signal current is converted to the signal voltage through the current-to-voltage converter LD to be finally inputted to the differential sense circuit SA. Similarly, the reference signal read out onto the dummy data line dd$_\alpha$ is converted into the signal current by the voltage-to-current converter SW2$_d$, whereon the signal current is converted to the signal voltage through the current-to-voltage converter LD$_d$ to be inputted to the differential sense circuit. Subsequently, when the signal RD is changed over to a high potential, there makes appearance a difference in potential between the nodes a and b internally of the differential sense circuit SA in dependence on the difference between the signal originating in the memory cell and the reference signal inputted to the differential sense circuit SA. By setting low the signal RD while setting high the signal CSN, the potential difference is amplified, allowing thus the signal originated in the memory cell to be detected. In that case, when the memory cell is charged at a high potential, there makes appearance a high potential at the node a with a low potential at the node b.

Next, by using the result of detection performed by the differential sense circuitry SA, data for restoring the memory cells are placed on the data lines. At first, the signals RG$_1$ and FL are set to low potential with a view to preventing a current flow of no use upon transfer of the data for restoration to the global data line cd. By setting high the signal WD, the amplified signal at the node b is transferred to the global data line cd via an inverter. In addition, the signal WG$_1$ is set high to allow the data for restoration to be transferred to the data line d$_\alpha$ through the switches SWW and SW. By setting low the signal GC$_{1\alpha}$, the data is held on the data line d$_\alpha$.

After detection of the memory cell signal read out onto the data line d$_\alpha$ and transferring of the data for restoration to the data line d$_\alpha$ in the manner described above, a memory cell signal on another one of the data lines is detected through a similar process. Namely, by setting the signal GC$_{1\beta}$ high, the memory cell signal on the data line d$_\beta$ is inputted to the voltage-to-current converter SW2 and at the same time the reference signals on the dummy data line d$_\alpha$ is inputted to the voltage-to-current converter SW2$_d$, which is then followed by operation similar to that performed for detecting the signal on the data line d, whereon detection of the signal on the data line d$_\beta$ and transfer of data for restoration to the data line d$_\beta$ are performed. By repeating the operations mentioned above, all the signals on the data lines d$_\alpha$, ..., d$_\delta$ are detected with the data for restoration being transferred to these data lines d$_\alpha$, ..., d$_\delta$. Finally, the word line is set to the unselected state, whereby the data for restoration are stored in the associated memory cells. The read operation is now completed.

The data read out form the individual memory cells can be taken out externally of the chip at the time the data is detected by the differential sense circuit SA. This can be accomplished, for example, by connecting the nodes a and b of the differential sense circuit SA to paired input/output lines $\overline{I/O}$ and $\overline{I/O}$ through switches YG (YG$_n$ and others) which are turned on and off under the control of signals Y (Y$_n$ and others) outputted from a decoder (not shown), as can be seen in FIG. 6. More specifically, when the memory cell signals transmitted to the nodes a and b of the differential sense circuit SA have been amplified sufficiently, the output signal Y$_n$ of the decoder is set high to turn on the switch YG$_n$, whereby the signals appearing on the nodes a and b are transmitted to the paired input/output lines $\overline{I/O}$ and $\overline{I/O}$ to be read out from the chip through an output circuit. On the other hand, data writing externally of the chip can also be carried out by transferring the data applied to the paired input/output lines $\overline{I/O}$ and $\overline{I/O}$ to the nodes a and b of the differential sense circuit SA through the switch YG$_n$.

Although only one row of the memory cell blocks is shown in FIG. 6, it goes without saying that the memory cell blocks are provided in a plurality of rows, as in the case of the memory array shown in FIG. 3, wherein the memory cell signals are simultaneously read out on the data lines within these memory cell blocks to be detected with the aid of the reference signal produced by the dummy cell block DCA provided in common to the plural rows of memory cell blocks.

Here, description will be directed to a method of imprementing the dummy data line and the dummy cell suited to the embodiments described above. As mentioned previously in conjunction with the first embodiment of the invention shown in FIG. 1, the dummy data line has to be realized such that the electric characteristics such as parasitic capacitance and others of the dummy data line are balanced with those of the data lines. Besides, the dummy cell is required to be realized in such a structure that it can store approximately a middle voltage level intermediate two voltage levels appearing on the data lines in correspondence to the data "1" and "0" stored in the memory cells and read out therefrom on the data lines, respectively. As an approach for satisfying the above requirement, there is conceived a method according to which the dummy cell is implemented in a same structure as the memory cell, wherein a voltage is stored at a terminal internally of the dummy cell which voltage is at a middle level between the voltages corresponding to the data "1" and "0" stored in the memory cells, respectively. This method will be elucidated below in some detail by reference to FIG. 6.

Referring to FIG. 6, the dummy cell DC is implemented in a same structure as the memory cell MC. A voltage of a middle level intermediate the voltages corresponding to the data "1" and "0", respectively, is previously stored across terminals internally of the dummy cell. More specifically, when the high and low potentials stored in the memory cell are $V_{cc}$ and 0 V, respectively, voltage $V_{cc}/2$ is stored in the dummy cell (according to a method which will be described hereinafter). When the word line is selected in this state, voltage corresponding to the data "1" or "0" is outputted from the memory cell, while a voltage substantially of a middle level between these data voltages is outputted from the dummy cell onto the dummy data line as the reference signal. Subsequently, the read operation described previously is performed. At first, signal on one of the data lines d$_\alpha$ is detected, whereon the result of the detection is placed onto the data line d$_\alpha$ as the data for restoring the memory cell and at the same time the reference signal voltage $V_r (=V_{cc}/2)$ is placed on the dummy data line dd$_\alpha$ by means of the MOS transistor Q$_1$ via the global dummy data line cdd and the switch SWW$_d$. In a similar manner, whenever a data for restoration is written on the other data lines, the reference signal voltage $V_r (=V_{cc}/2)$ is simultaneously outputted on the dummy data line dd$_\alpha$ as well. After repeating this operation for all the data lines, the word line is changed over to the unselected state, whereby the data voltages corresponding to the data "1" and/or "0" are stored in the memory cells with the voltage $V_{cc}/2$ being stored in the dummy cell.

By using the dummy cell of the same structure as that of the memory cell as described above, the dummy data line can equally be implemented in the same structure. Thus, it is possible to balance the electric characteristics of the dummy data line with those of the data lines. Further, because the voltage of a level intermediate the data voltages corresponding to the data "1" and "0" is stored across the terminals internally of the dummy cell, the intermediate voltage of the middle level as mentioned previously is outputted onto the dummy data line upon selection of a word line. Further, the intermediate voltage once stored in the dummy cell simultaneously with the restoration data writing to the memory cells is left as it is till the next selection of the word line. In other words, the potential of the dummy cell is progressively lowered due to a leak current in the course of time lapse as with the case of the high data potential of the memory cell. Consequently, the level relation between the high data potential of the memory cell and the potential of the dummy cell can be held for an extended period when compared with the hitherto known dummy cell implementation method according to which a circuit for setting a desired potential across the terminals of the dummy cell is additionally provided in association with the dummy cell to maintain the dummy potential at the fixed level during the precharging, as is disposed, for example, in "1980 IEEE ISSCC Digest of Technical Papers, pp. 234-235". To say in another way, according to the invention, the time taken for the high data potential to be attenuated to such a level at which the high data potential is erroneously identified as the low data potential, i.e. the data holding period can be extended. This means that the time interval at which the memory cell is refreshed is correspondingly elongated, which in turn means that the time taken for performing the memory cell refreshing operation for the semiconductor memory can be shortened, as a result of which the time for which the system is allowed to use the semiconductor memory can be increased. Besides, because power consumption involved in the refreshing operation can be reduced, the use life of a battery employed for backing up the semiconductor memory can also be extended, to another advantage.

Other various methods may be adopted for implementing the dummy data line and the dummy cell. For example, in the case where the data line is precharged to $V_{cc}/2$, as described above in conjunction with the fifth embodiments of the invention, the precharge voltage can be made use of as the reference signal voltage. When the dummy cell of the same configuration as the memory cell is used, the transistor constituting the former should be so implemented as not to be turned on upon selection of the word line. This can be achieved, for example, by implanting impurity ions in a channel region of the transistor for the dummy cell or by thickening partially the gate oxide film of the transistor to thereby increase the threshold voltage thereof. With this arrangement, the electric characteristics of the dummy data line can be balanced with those of the data lines. Although this method requires a complicated fabrication process, the necessity for setting the middle or intermediate terminal voltage in the dummy cell described hereinbefore can be eliminated, resulting in simplification and facilitation in the operation control.

In conjunction with the memory array shown in FIG. 6, it has been described that the data for restoration is placed on the data line every time the signal read out onto the data line is detected by the differential sense circuit, by utilizing the result of the detection. In this connection, attention should be paid to noise due to the coupling capacitance between the adjacent data lines, when the pitch thereof is fine. Let's assume, by way of example, that the signal on the data line $d_\alpha$ in the memory array shown in FIG. 6 is detected, whereon the data for restoration is to be placed on the data line $d_\alpha$. In that case, when a signal which is not yet amplified exists on the data line $d_\beta$ upon placing the data for memory cell restoration on the data line $d_\alpha$ due to the coupling capacitance between the data lines $d_\alpha$ and $d_\beta$, there may arise such possibility that the signal on the data line $d_\beta$ is detected erroneously by the differential sense circuitry.

This problem can however be solved by using additional shielding conductive layers between the data lines to thereby decrease the coupling capacitance mentioned above, as disclosed, for example, in "IEEE, Trans. on Electronic Devices, Vol. 37, No. 3 (March 1990), pp. 737–743.

By using the memory cells whose data lines are shielded from one another as mentioned above, noise due to the coupling capacitance between the data lines can be reduced even upon reading out the signals on the data lines from the memory cells. Such noise reduction measures can equally be adopted in the embodiments described hereinbefore.

As will be apparent from the foregoing, the memory array according to the fifth embodiment of the invention shown in FIG. 6 is arranged such that the dummy data line is shared by a plurality of the data lines. Owing to this arrangement, the memory cells can be disposed at all the cross-points or intersections between the data lines and the dummy data lines. Besides, not only a high density implementation but also a high S/N ratio can be realized for the read operation by virtue of the arrangement that one and the same word line intersects the data lines and the dummy data line, as in the case of the folded data-line arrangement. Furthermore, because the voltage-to-current converter SW2, switch SWW, current-to-voltage converter LD and the differential sense circuit SA are shared by a plurality of the data lines, the layout pitch of these circuits can be mitigated or rendered more gentle, making it easier to fit the pitch to the high-density memory cell layout.

In the case of the memory array shown in FIG. 6, the precharge circuit PC is provided in common to the plural data lines for precharging thereof by the switch SW. It should however be understood that the precharge circuit may be provided for each of the data lines. In that case, intermediation of the switch SW becomes unnecessary, facilitating thereby the control of the signals $GC_{1\alpha}, \ldots, GC_{1\delta}$.

In the foregoing, several embodiments of the present invention which are believed to be preferred have been described. However, it is never intended to restrict the present invention to these illustrative embodiments. Numerous modifications and changes may readily occur to those skilled in the art without departing from the scope and spirit of the invention. For example, although it has been described that the differential sense circuit SA in the memory array shown in FIG. 1 is composed of a CMOS, other circuit configurations may be adopted. The gist of the invention is to be seen in that the reference signal on the dummy data lines provided in common to a plurality of data lines is used in common by a plurality of differential sense circuits. Accordingly, it is sufficient to constitute the differential amplifier such that the reference signal inputted to the differential sense circuitries SA undergoes no fluctuation upon signal detections by the individual differential sense circuits. Obviously, the CMOS constituting the differential sense circuit may be replaced by a bipolar or a combination of a bipolar and a CMOS. Although the combination of the bipolar and the CMOS tends to increase the area occupied by the differential sense circuit when compared with the one constituted by the CMOS only, the former can ensure the differential signal detection with a higher sensitivity by virtue of the use of the bipolar element.

SIXTH EMBODIMENT

In the foregoing, the present invention has been described in conjunction with the two-level storage memory. In the following, description will be made of an exemplary embodiment of a multiple-level storage memory according to the invention in which one memory cell can store three or more voltage levels.

Figure 8:
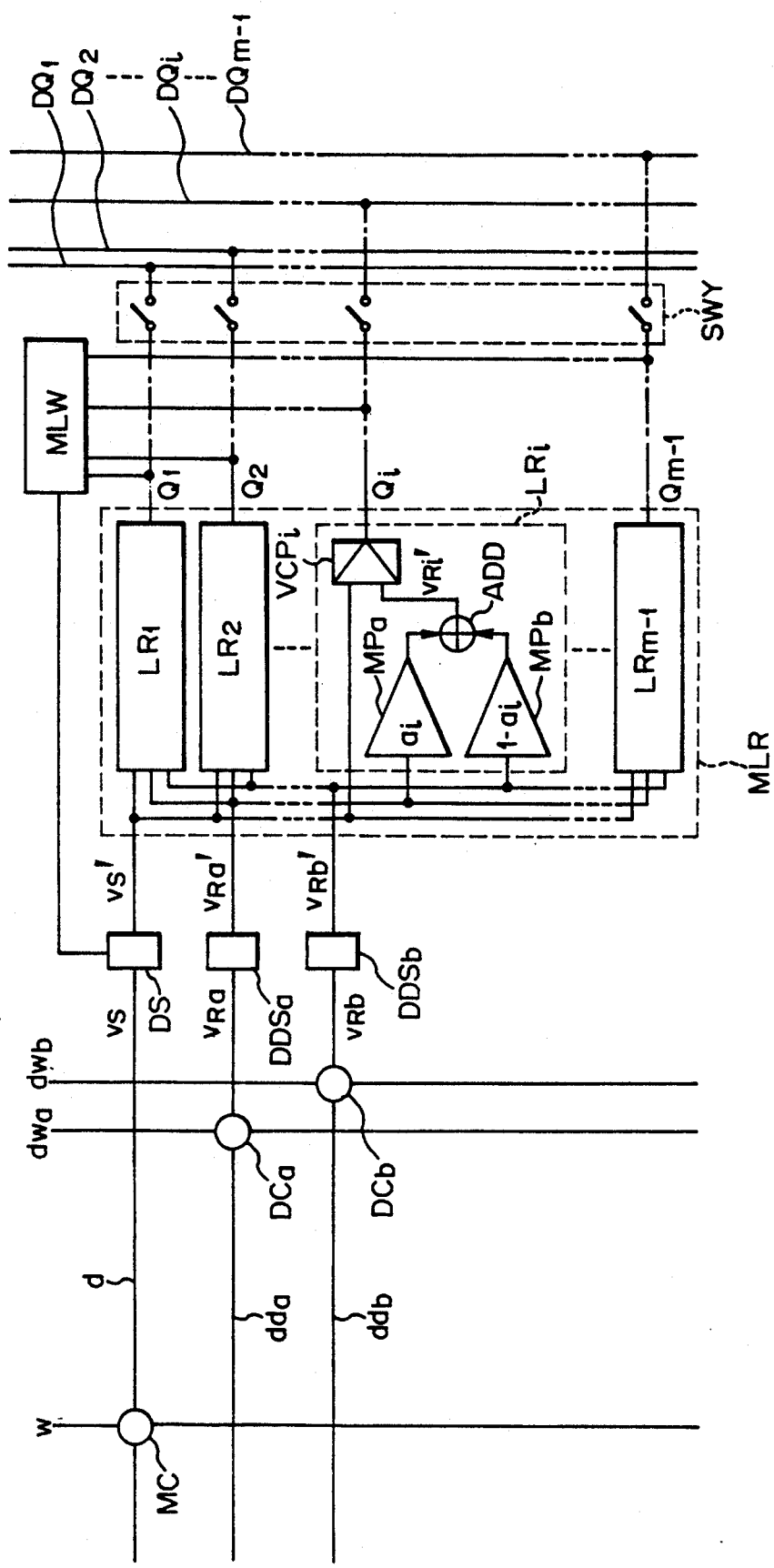
FIG. 8 is a schematic circuit diagram showing conceptually a multiple-level storage memory taught by the invention.
Figure 9:
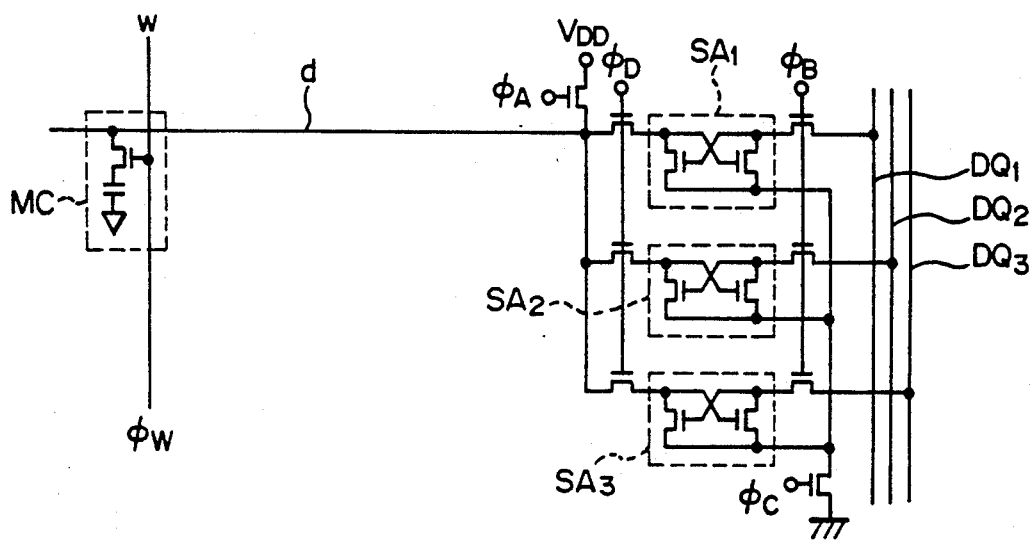
FIG. 9 is a view for illustrating a prior art semiconductor multiple-level storage memory.

FIG. 8 is a schematic circuit diagram showing conceptually an embodiment of the multiple-level storage memory taught by the invention. Referring to the figure, there are disposed dummy data lines $dd_a$ and $dd_b$ in parallel with a data line d to which there are connected a number of memory cells MC (only one memory cell is shown in FIG. 8) which can be selected by respective word lines W, while dummy cells $DC_a$ and $DC_b$ which can be selected by dummy word lines $DW_a$ and $DW_b$ are connected to the dummy data lines $dd_a$ and $dd_b$, respectively. The intrinsic data line d and the dummy data lines $dd_a$ and $dd_b$ are connected to a multiple-level sense circuit MLR through the signal transfer circuitries DS and $DDS_a$, $DDS_b$ which serve for eliminating the influence of input impedance of the multiple-level sense circuit MLR and of which input voltage and output voltage are linear. The multiple-level sense circuit MLR is composed of i sense circuitries $LR_1$ (where $i=1, 2, \ldots, m-1$). The signal transfer circuitry DS is also connected to a multiple-level supply circuit MLW. The multiple-level sense circuit MLR and the multiple-level supply circuit MLW are connected to input/output lines DQ through a switch circuit WY.

The memory cell MC stores one of m voltage levels $V_1, V_2 \ldots$ and $V_m$. By reading a given one or the memory cells MC, there makes appearance on the data line one of m signal voltage $V_{S1}, V_{S2}, \ldots, V_{Sm}$ in dependence on the data stored in the given one memory cell. A signal voltage $V_S'$ (one of $V_{S1}', V_{S2}', \ldots$ and $V_{Sm}'$) which corresponds to the signal voltage $V_S$ on the data line is outputted from the signal transfer circuitry DS to be inputted to the multiple-level sense circuit MLR. Similarly, upon reading of known levels $V_a$ and $V_b$ from the dummy cells $DC_a$ and $DC_b$, voltages $V_{Ra}$ and $V_{Rb}$ make appearance on the dummy data lines $dd_a$ and $dd_b$, respectively, whereby corresponding output voltage $V_{Ra}'$ and $V_{Rb}'$ of the signal transfer circuitries $DDS_a$ and $DDS_b$ are inputted to the multiple-level sense circuit MLR.

The multiple-level sense circuit MLR compares magnitude of the signal voltage $V_S'$ appearing on the data line with magnitudes of middle voltages intermediate the adjacent ones of m voltage levels, i.e. (m−1) reference voltages $V_{R1}'$, $V_{R2}'$, ..., $V_{R(m-1)}$, to thereby decide which of the m level voltages the signal voltage $V_S'$ on the data line corresponds to. In this conjunction, it is assumed that $$V_{S1}' < V_{R1}' < V_{S2}' < V_{R2}' < \ldots < V_{R(m-1)}' < V_{Sm}' \quad (1.1)$$

The comparisons of the signal voltage $V_S'$ with (m−1) reference voltages are performed by (m−1) sense circuits $LR_i$. The reference comparison level $V_{Ri}'$ used in the decision performed by the sense circuit $LR_i$ can be obtained by multiplying the voltage $V_{Ra}'$ with a constant $a_i$ by a constant multiplier $MP_a$ while multiplying the voltage $V_{Rb}'$ with (1−$a_i$) by a constant multiplier $Mb_b$ and by determining a sum of both products by an adder ADD. Thus, the reference level $V_{Ri}$ is given by $$V_{Ri}' = a_i V_{Ra}' + (1-a_i) V_{Rb}' \quad (1.2)$$

where $V_{Ra}'$ and $V_{Rb}'$ can be set at given values, and the value $a_i$ appearing in the expression (1.2) is determined in accordance with the values of $V_{Ra}'$ and $V_{Rb}'$. In other words, the voltage $V_a$ and $V_b$ stored in the dummy cells $DC_a$ and $DC_b$ may be of any given values so far as they are known. Magnitude of the voltages $V_S'$ relative to that of $V_{Ri}'$ is determined by a voltage comparator $VCP_1$, the output of which constitutes the output $Q_1$ of the sense circuit $LR_i$.

The detection result obtained by the multiple-level sense circuit MLR is inputted to the multiple-level supply circuit MLW, whereby a voltage corresponding to that result is transmitted to the data line d by way of the signal transfer circuitry DS to be rewritten in the memory cell MC from which the data has been read out. Further, the switch SWY is controlled by a Y-decoder (not shown) so that the output $Q_1$ of the multiple-level sense circuit MLR is outputted onto the input/output line $DQ_i$. By deriving the (m−1) reference levels for comparison from the two signals as described above, the number of the dummy data line need not be more than two. When the pair of dummy data lines $dd_a$ and $dd_b$ are disposed adjacent to the data line d, noise components of the reference level for the comparison are made substantially identical with noise component $v_N$ contained in the signal voltage appearing on the data line d. In this case, the reference level $V_{R1}'$ for comparison is given by $$\begin{aligned} V_{Ri}' &= a_i(V_{Ra}' + v_N) + (1-a_i)(V_{Rb}' + v_N) \\ &= a_i V_{Ra}' + (1-a_i) V_{Rb}' + v_N \\ &= V_{Ri}' + v_N \end{aligned} \quad (1.3)$$

As apparent from the above expression, the reference voltage $V_{Ri}'$ is added with the noise component $v_N$. Consequently, noise component contained in the reference level for comparison derived from the signal appearing on the dummy line coincides with the noise component appearing on the data line, whereby influence of the noise component is eliminated by the voltage comparator $VCP_i$.

When occasion requires, there may be provided three or more dummy data lines connected to the dummy cells, wherein the signals appearing on these data lines may be multiplied with constants and a sum of products resulting from the multiplications. In that case, a range of the values of the constants serving as the weighting or product coefficients can be widened.

Further, with a view to suppressing the influence of the input impedance of the multiple-level sense circuit MLR, the signal transfer circuits DS as well as $DDS_a$ and $DDS_b$ are employed. However, in case the input impedance of the circuit MLR is sufficiently high, the data line d as well as the dummy data lines $dd_a$ and $dd_b$ may be connected directly to the multiple-level sense circuit MLR.

Figure 10A:
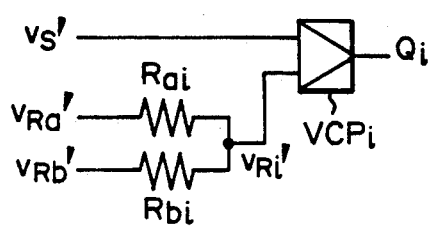
FIG. 10A shows a circuit configuration of a sense circuit based on a resistive voltage division.

FIG. 10A shows, by way of example, a circuit configuration of the sense circuitry $LR_i$. The intermediate voltage $V_{Ri}'$ between the input voltages $V_{Ra}'$ and $V_{Rb}'$ is obtained through resistive voltage division. To this end, two resistors $R_{ai}$ and $R4b_i$ are connected at one ends in series to each other, wherein the voltages $V_{Ra}'$ and $V_{Rb}'$ are, respectively, applied to other ends of these resistors. As a result, there is obtained from a junction between the two resistors $R_{ai}$ and $R_{bi}$ a voltage $V_{R1}'$ which is given by $$V_{Ri}' = (R_{bi} V_{Ra}' + R_{ai} V_{Rb}')/(R_{ai} + R_{bi}) \quad (3.1)$$

Accordingly, by definition $$R = R_{ai} + R_{bi} \quad (3.2)$$

and when $$R_{ai} = (1-a_i) R \quad (3.3)$$

$$R_{bi} = a_i R, \quad (3.4)$$

the voltage $V_{Ri}'$ is given by the expression (1.2). By using this voltage as the reference voltage, the input signal voltage $V_S'$ is sensed through comparison. Multiplication of the two signal voltages with constants and addition of the products are realized by the two resistors. Thus, the circuit can be be scaled down, to additional advantage.

Figure 10B:
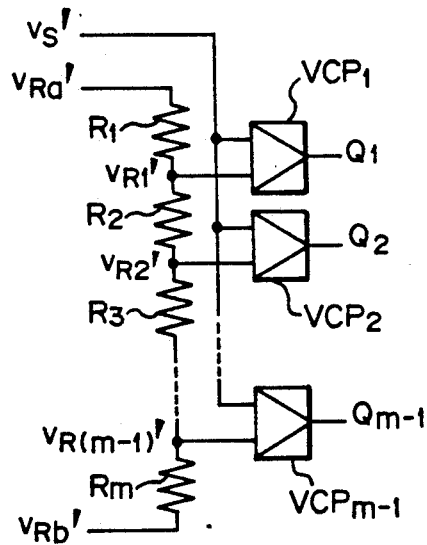
FIG. 10B shows an exemplary circuit configuration of a multiple-level sense circuit in which a resistive voltage division is adopted.

FIG. 10B shows, an exemplary circuit configuration of the multiple-level sense circuit MLR which is constituted by a combination of the (m−1) sense circuitries $LR_i$ having the structure shown in FIG. 10A. There are employed m shared voltage dividing resistors $R_1$, $R_2$, $R_3$, ..., $R_m$. On the condition that the (m−1) reference voltages $V_{Ri}'$ have a relation given by $$V_{Ra}' < V_{R1}' < V_{R2}' < \ldots < V_{R(m-1)}' < V_{Rb}' \quad (3.5)$$

the signal voltage $V_S'$ is compared with these reference voltages by (m−1) voltage comparators $VCP_i$. The desired reference voltages can be obtained as follows. By definition $$R = R_1 + R_2 + R_3 + \ldots + R_m \quad (3.6)$$

and representing $R_1$ by $$R_1 = a_1 R \quad (3.7)$$

then, $R_j$ (where j=2, 3, ... m−1) is given by $$R_j = a_j R - a_{(j-1)} R \qquad (3.8)$$
$$= (a_j - a_{(j-1)}) R$$

Thus, $R_m$ is determined:

$$R_m = (1 - a_{(m-1)}) R \qquad (3.9)$$

Figure 11A:
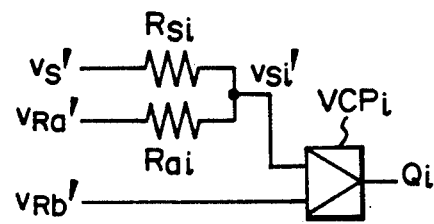
FIG. 11A shows another exemplary circuit configuration of the sense circuit.

FIG. 11A shows another exemplary circuit configuration of the sense circuit $LR_i$ which is based on the resistive voltage division. In the case of the sense circuit $LR_i$ shown in FIG. 10A, the reference voltage $V_{Ri}'$ is generated through division of the voltages $V_{Ra}'$ and $V_{Rb}'$ by using resistors. In contrast, in the case of the sense circuit $LR_i$ shown in FIG. 11A, the voltage $V_{Si}$ generated by resistive division of the signal voltage $V_S'$ appearing on the data line and the voltage $V_{Ra}'$ is inputted to the voltage comparator $VCP_i$ to be compared with the voltage $V_{Rb}'$. With the circuit configuration shown in FIG. 10A, the voltage $V_{Ri}'$ is limited to a level intermediate the voltages $V_{Ra}'$ and $V_{Rb}'$. When it is desired to set the reference voltage $V_{Ri}'$ such that $V_{Ra}' < V_{Rb}' < V_{Ri}'$, then from the expression (1.2), $$a_i < 0, \ 1 - a_i > 1 \qquad (4.1)$$

Thus, with the circuit configuration shown in FIG. 10A, $R_{bi}$ given by the expression (3.4) becomes negative. Consequently, it is impossible to obtain the desired reference voltage $V_{Ri}'$ mentioned above. On the other hand, with the circuit configuration shown in FIG. 11A, the range in which the reference voltage $V_{Ri}'$ can be obtained is equivalently broadened.

The voltage $V_{Si}$ generated proportionally by dividing the voltages $V_S'$ and $V_{Ra}'$ by two resistors $R_{Si}$ and $R_{ai}$ is given by $$V_{Si}' = (R_{ai} V_S' + R_{Si} V_{Ra}')/(R_{Si} + R_{ai}) \qquad (4.2)$$

Here, by definition $$R = R_{Si} + R_{ai} \qquad (4.3)$$

and representing values of the resistors $R_{Si}$ and $R_{ai}$ by $$R_{Si} = -a_i R/(1 - a_i), \qquad (4.4)$$

$$R_{ai} = R/(1 - a_i) \qquad (4.5)$$

then $$V_{Si}' = (V_S' - a_i V_{Ra}')/(1 - a_i) \qquad (4.6)$$

Thus, the differential signal inputted to the voltage comparator $VCP_i$ is given by $$V_{Si}' - V_{Rb}' = (V_S' - a_i V_{Ra}')/(1 - a_i) - V_{Rb}' = [V_S' - \{a_i V_{Ra}' + (1 - a_i) V_{Rb}'\}]/(1 - a_i) \qquad (4.7)$$

It is thus apparent that the signal voltage $V_S'$ is compared with the reference voltage $V_{Ri}'$ given by the expression (1.2) by the voltage comparator $VCP_i$. Reversely, when the reference voltage $V_{Ri}'$ is to be so set as to satisfy the condition that $V_{Ri}' < V_{Ra}' < V_{Rb}'$, this can be achieved by comparing the voltage $V_{Si}'$ obtained through the resistive voltage division of $V_S'$ and $V_{Rb}'$ with the reference voltage $V_{Ra}'$ by the voltage comparator $VCP_i$.

Figure 11B:
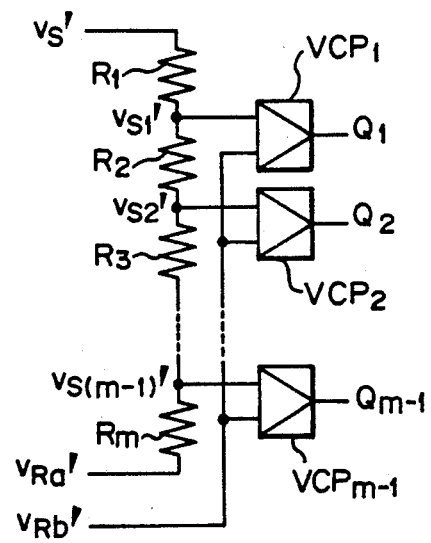
FIG. 11B shows another exemplary circuit configuration of the multiple-level sense circuit.

FIG. 11B shows an exemplary circuit configuration of a multiple-level sense circuit MLR which is constituted by combination of the $(m-1)$ sense circuits $LR_i$ each having the structure shown in FIG. 11A. There are employed m shared voltage dividing resistors $R_1$, $R_2$, $R_3$, ..., $R_m$. On the condition that the $(m-1)$ reference voltages $V_{Ri}'$ have a relation given by $$V_{Ra}' < V_{Rb}' < V_{R1}' < V_{R2}' < \ldots < V_{R(m-1)}' \qquad (4.8)$$

the signals voltage $V_S'$ is compared with these reference voltages by $(m-1)$ voltage comparators $VCP_i$. The desired reference voltages can be obtained as follows. By definition $$R = R_1 + R_2 + R_3 + \ldots + R_m \qquad (4.9)$$

and representing $R_1$ by $$R_1 = -a_1 R/(1 - a_1) \qquad (4.10)$$

then, $R_j$ (where $j = 2, 3, \ldots, m-1$) is given by $$R_j = -a_j R/(1 - a_j) - \{-a_{(j-1)} R/(1 - a_{(j-1)})\} \qquad (4.11)$$
$$= \{-a_j/(1 - a_j) + -a_{(j-1)}/(1 - a_{(j-1)})\} R$$

Thus, $R_m$ is given by $$R_m = R/(1 - a_{(m-1)}) \qquad (4.12)$$

As in the case of the multiple-level sense circuit MLR shown in FIG. 10B, it is sufficient to use only m voltage dividing resistors.

In the case of the embodiment shown in FIGS. 10A to 11B, resistors are employed for dividing voltages. However, voltage dividing means can be constituted with other kinds of devices. By way of example, voltages can be divided by capacitors, which is easier to implement with the MOS technology than resistors.

Figure 12:
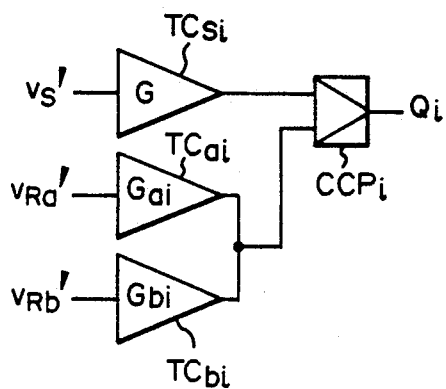
FIG. 12 shows yet another exemplary circuit configuration of the sense circuit in which voltage-to-current converters are employed.

FIG. 12 shows another exemplary circuit configuration of the sense circuitry $LR_i$. In the case of the sense circuitries $LR_i$ shown in FIGS. 10A and 11A, the multiplication and addition represented by the expression (1.2) are realized by resorting to the use of the voltage dividing resistors. To this end, there are required high-precision resistors exhibiting good linearity. With the circuit configuration shown in FIG. 12, voltage-to-current converters TC ($TC_{Si}$, $TC_{ai}$, $TC_{bi}$) are employed to make unnecessary the use of such expensive resistors. The voltage-to-current converters $TC_{Si}$, $TC_{ai}$ and $TC_{bi}$ have respective transconductances G, $G_{ai}$ and $G_{bi}$ with which weighting is realized. By connecting in common the output terminals of the voltage-to-current converters $TC_{ai}$ and $TC_{bi}$, a sum $I_{Ri}$ of the output currents of these converters $TC_{ai}$ and $TC_{bi}$ can be obtained. The output current of the converter $TC_{Si}$ and the sum current $I_{Ri}$ are compared by the current comparator $CCP_i$. It is assumed that the transconductances $G_{ai}$ and $G_{bi}$ have respective values given by $$G_{ai} = a_i G, \qquad (5.1)$$

$$G_{bi} = (1 - a_i) G \qquad (5.2)$$

Then, $I_{Ri}$ is given by $$I_{Ri} = G_{ai}V_{Ra}' + G_{bi}V_{Rb}' \qquad (5.3)$$
$$= G\{a_iV_{Ra}' + (1-a_i)V_{Rb}'\}$$

It is thus apparent that there can be obtained the current which corresponds to the reference voltage $V_{Ri}'$ given by the expression (1.2).

Figure 13:
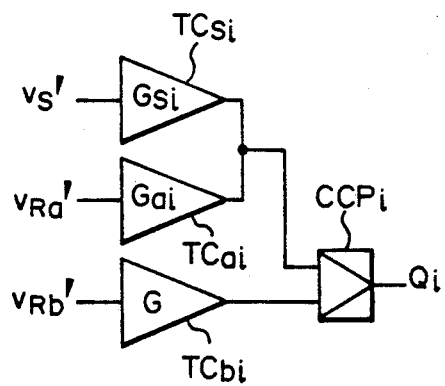
FIG. 13 shows still another exemplary circuit configuration of the sense circuit in which voltage-to-current converters are employed.

FIG. 13 shows another exemplary circuit configuration of the sense circuit $LR_i$ in which voltage-to-current converters are employed. When the transconductance of the voltage-to-current converter is limited to a positive value, the reference voltage $V_{Ri}'$ is limited to a value between $V_{Ra}'$ and $V_{Rb}'$ in the circuit configuration shown in FIG. 12, as with the case of the embodiment shown in FIG. 10A. By way of example, when it is desired to set the reference voltage $V_{Ri}'$ such the condition $V_{Ra}' < V_{Rb}' < V_{Ri}'$ is satisfied, then from the expression (1.2), $$a_i < 0, \; 1-a_i > 1 \qquad (6.1)$$

Accordingly, with the circuit configuration in which the transconductance $G_{ai}$ assumes a negative value, as apparent from the expression (5–1), the abovementioned condition can not be realized. Thus, in the case of the circuit configuration shown in FIG. 13, connections between the output terminals of the voltage-to-current converters are so modified that the range in which the reference voltage $V_{Ri}'$ can be obtained is equivalently broadened. More specifically, representing the transconductances of the voltage-to-current converters $TC_{Si}$, $TC_{ai}$ and $TC_{bi}$ by $G_{Si}$, $G_{ai}$ and $G$, respectively, which are given by $$G_{Si} = -a_iG/(1-a_i), \qquad (6.2)$$

$$G_{ai} = G/(1-a_i) \qquad (6.3)$$

a sum $I_{Si}$ of the output currents of the voltage-to-current converters $TC_S$ and $TC_{ai}$ is $$I_{Si} = G_{Si}V_S' + G_{ai}V_{Ra}' \qquad (6.4)$$
$$= G(V_S' - a_iV_{Ra}')/(1-a_i)$$

Thus, difference between the sum current $I_{Si}$ and the output current $I_{bi}$ of the voltage-to-current converter $TC_{bi}$ is determined in accordance with:

$$I_{Si} - I_{bi}' = G(V_S' - a_iV_{Ra}')/(1-a_i) - GV_{Rb}' \qquad (6.5)$$
$$= G[V_S' - \{a_iV_{Ra}' + (1-a_i)V_{Rb}'\}]/(1-a_i)$$

In this manner, the differetial current given by the expression (6.5) and inputted to the current comparator $CCP_i$ corresponds to the difference between the signal voltage $V_S'$ and the reference voltage $V_{Ri}'$ given by the expression (1.2).

On the other hand, when the reference voltage $V_{Ri}'$ is to be set such that $V_{Ri}' < V_{Ra}' < V_{Rb}'$, the output terminals of the voltage-to-current converters $TC_{bi}$ and $TC_S$ are connected in common. The sum of the output currents of the voltage-to-current converters $TC_{bi}$ and $TC_S$ is then inputted to the current comparator $CCP_i$ along with the output current of the voltage-to-current converter $TC_{a1}$ to undergo comparison with the latter.

Figure 14:
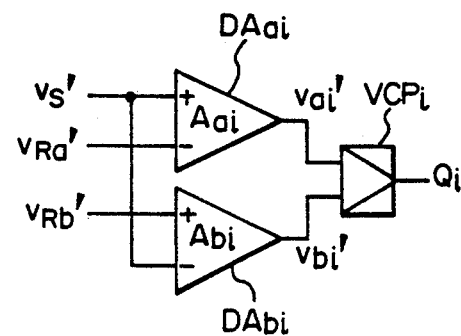
FIG. 14 shows a further exemplary circuit configuration of the sense circuit in which differential amplifiers are employed.

FIG. 14 shows yet another exemplary circuit configuration of the sense circuitry $LR_i$, which is composed of differential amplifiers $DA_{ai}$ and $DA_{bi}$ and a voltage comparator $VCP_i$. By definition, gains $A_{ai}$ and $A_{bi}$ of the differential amplifiers $DA_{ai}$ and $DA_{bi}$ are expressed by the following expressions (7.1) and (7.2), respectively.

$$A_{ai} = a_iA, \qquad (7.1)$$

$$A_{bi} = (1-a_i)A \qquad (7.2)$$

where A represents a given value of the gain. Then, the output voltages $V_{ai}'$ and $V_{bi}'$ of the differential amplifiers $DA_{ai}$ and $DA_{bi}$ are, respectively, given by $$V_{ai}' = a_iA(V_S' - V_{Ra}') \qquad (7.3)$$

$$V_{bi}' = (1-a_i)A(V_{Rb}' - V_S') \qquad (7.4)$$

Accordingly, the differential voltage inputted to the voltage comparator $VCP_i$ can be determined in accordance with:

$$V_{ai}' - V_{bi}' = A\{a_i(V_S' - V_{Ra}') - (1-a_i)(V_{Rb}' - V_S')\} \qquad (7.5)$$
$$= A[V_S' - \{a_iV_{Ra}' + (1-a_i)V_{Rb}'\}]$$

Comparison is thus performed for the signal voltage $V_S'$ and the reference voltage $V_{Ri}'$ given by the expression (1.2).

Gain of the differential amplifier $DA_{ai}$, $DA_{bi}$ can assume a negative value by exchanging the polarities of the input terminals, which means that the reference voltage $V_{Ri}'$ can be set at a desired value. For example, when the reference voltage $V_{Ri}'$ is to be set such that $V_{Ra}' < V_{Rb}' < V_{Ri}'$, then from the expression (1.2), $$a_i < 0, \; 1-a_i > 1 \qquad (7.6)$$

Thus, from the expression (8.1), $A_{ai}$ of the differential amplifier $DA_{ai}$ must be of a negative value with the circuit configuration shown in FIG. 14. This can be realized by inputting the reference voltage $V_{Ra}'$ to the positive input terminal of the differential amplifier $DA_{ai}$ with the signal voltage $V_S$ being inputted to the negative input terminal thereof, while gain $A_{ai}$ of the differential amplifier $D_{ai}$ is selected as follows:

$$A_{ai} = a_iA \qquad (7.7)$$

Reversely, in case the reference voltage $V_{Ri}'$ is to be so set that $V_{Ri}' < V_{Ra}' < V_{Rb}'$, the signal voltage $V_S'$ is inputted to the positive input terminal of the differential amplifier $DA_{bi}$ with the reference voltage $V_{Rb}'$ being applied to the negative input terminal to thereby invert the input polarity of the differential amplifier $DA_{bi}$.

Figure 15:
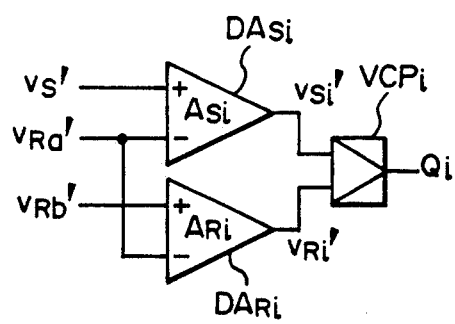
FIG. 15 shows a still further circuit configuration of the sense circuit which is constituted by a pair of differential amplifiers and a voltage comparator.

FIG. 15 shows a further exemplary circuit configuration of the sense circuit $LR_i$, which is constituted by a pair of differential amplifiers and a voltage comparator $VCP_i$ similarly to the sense circuitry shown in FIG. 14 except for the interconnection of these constituents. Representing gain of the differential amplifier $DA_{Si}$ by A, gain $A_{Ri}$ of the differential amplifier $DA_{Ri}$ is given by $$A_{Ri} = (1-a_i)A \qquad (8.1)$$

Since the output voltages $V_{Si}'$ and $V_{Ri}'$ of the differential amplifiers $DA_{Si}$ and $DA_{Ri}$ are, respectively, given by $$V_{Si}' = A(V_S' - V_{Ra}'), \qquad (8.2)$$

$$V_{Ri}' = (1-a_i) A (V_{Rb}' - V_{Ra}') \qquad (8.3)$$

the differential voltage inputted to the voltage comparator $VCP_i$ is determined as follows:

$$\begin{aligned} V_{ai}' - V_{bi}' &= A\{(V_S' - V_{Ra}') - (1-a_i)(V_{Rb}' - V_{Ra}')\} \\ &= A[V_S' - \{a_i V_{Ra}' + (1-a_i) V_{Rb}'\}] \end{aligned} \qquad (8.4)$$

In this way, the signal voltage $V_S'$ is compared with the reference voltage $V_{Ri}'$ given by the expression (1.2). With this arrangement, gain for the signal voltage $V_S'$ remains to be a constant value A independent of the weighting coefficient $a_i$. In the case of the sense circuit shown in FIG. 14, the ratio of gains of the two differential amplifiers is $$A_{ai}/A_{bi} = a_i/(1-a_i) \qquad (8.5)$$

In contrast, with the arrangement shown in FIG. 15, the abovementioned ratio is $$A/A_{Ri} = 1/(1-a_i) \qquad (8.6)$$

As is apparent from the above, when $a_i < 0$ or $a_i > 1$, the range of gain can be narrowed, whereby good matching can be attained between the differential amplifiers.

In the sense circuits shown in FIGS. 14 and 15, the differential amplifier is implemented as the voltage-input/voltage-output differential amplifier. It should however be understood that the sense circuits can equally be implemented by using the voltage-input/current-output differential amplifiers substantially to same effects. In this case, the voltage comparator is of course replaced by a current comparator.

In the following, the present invention will be described in more concrete in conjunction with embodiments in which one-transistor/one-capacitor type memory cells are employed on the assumption that the memory cell is written with one of the voltages $V_1 = 0$ (volt), $V_2 = V_{cc}/3$, $V_3 = 2V_{cc}/3$ and $V_4 = V_{cc}$ to cause the cell to store electric charge of a corresponding quantity so that four-level data can be stored in the memory array. Accordingly, in the following description, it is assumed that $m = 3$ and that $i = 1, 2, 3$.

SEVENTH EMBODIMENT

Figure 16:
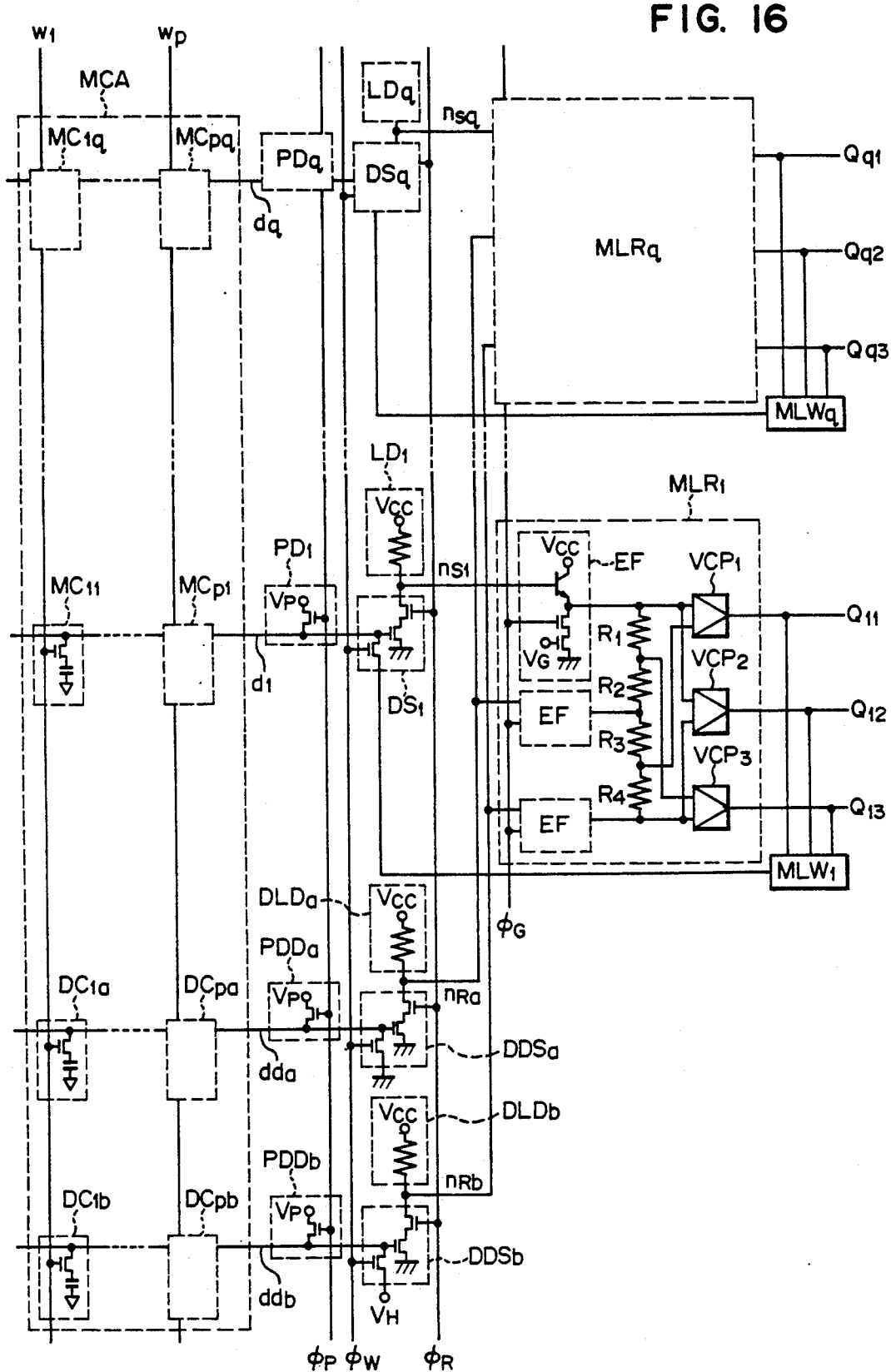
FIG. 16 shows a seventh embodiment of the memory array according to the present invention.

FIG. 16 shows a seventh embodiment of the memory array according to the invention in which a pair of dummy data line $dd_a$ and $dd_b$ are shared by q data lines $(d_1, \ldots, d_q)$. Since it is sufficient to provide only two dummy data lines for q data lines, increase in the area of the memory array due to provision of the dummy data lines can be suppressed to a minimum.

Referring to FIG. 16, there are provided p word lines $(W_1, \ldots, W_p)$ in parallel with one another and q data lines d $(d_1, \ldots, d_q)$ in an array that the data lines intersect the word lines, wherein memory cells MC ($MC_{11}$ and others) are disposed at the intersections, respectively. Disposed in parallel with the data lines d the dummy data lines $dd_a$ and $dd_b$ to which dummy cells $DC_a$ ($DC_{1a}, \ldots, DC_{pa}$) and $DC_b$ ($DC_{1b}, \ldots, DC_{pb}$) each of a same structure as the memory cells MC, respectively, are connected to each data line. The dummy cell $DC_a$, $DC_b$ is selected by the same word line W by which the memory cells MC are selected.

The dummy cell $DC_a$ is stored with the ground potential of 0 (volt) with the dummy cell $DC_b$ being stored with an intermediate voltage $V_H = V_{cc}/2$. When electric charge is read out from a given one of the memory cells MC to the data line d, the charges are read out also from the corresponding dummy cells $DC_a$ and $DC_b$ onto the dummy data lines $dd_a$ and $dd_b$ to thereby cause voltages $V_{Ra}$ and $V_{Rb}$ to make appearance on the dummy data lines $dd_a$ and $dd_b$, respectively. By utilizing these voltages $V_{Ra}$ and $V_{Rb}$, the signal voltage $V_S$ produced on the data line due to the reading of the memory cell MC is discriminatively identified. Connected to the data lines d and the dummy data lines $dd_a$ and $dd_b$ are precharge circuits PD ($PD_1, \ldots, PD_q$) and $Pdd_a$, $Pdd_b$, signal transfer circuitries DS ($DS_1, \ldots, DS_q$) and $DDS_a$, $DDS_b$, and load circuitries LD ($LD_1, \ldots, LD_q$) and $DLD_a$, $DLD_b$, respectively. In read operation, the signal transfer circuitries DS and $DDS_a$, $DDS_b$ operate as source-grounded amplifiers having loads provided by the load circuit LD and $DLD_a$, $DLD_b$, respectively. Outputs $V_S'$ and $V_{Ra}'$, $V_{Rb}'$ are applied to input terminals $N_S$ ($N_{S1}, \ldots, N_{Sq}$) and $N_{Ra}$, $N_{Rb}$ of multiple-level sense circuits MLR ($MLR_1, \ldots, MLR_q$) provided for the data lines d, respectively. Further, provided in correspondence to the data lines d are multiple-level supply circuits MLW ($MLW_1, \ldots, MLW_q$), respectively, which are connected to the signal transfer circuitries DS, respectively. The signal transfer circuitries $DDS_a$ and $DDS_b$ are connected to voltage sources which output the ground potential of 0 (volt) and the intermediate voltage $V_H$.

The multiple-level sense circuit MLR is constituted by three emitter-followers EF, four voltage dividing resistors $R_1, \ldots, R_4$, and three voltage comparators $VCP_1$, $VCP_2$ and $VCP_3$. The emitter-follower EF serves as a buffer for protecting the resistive voltage division against the influence of the load circuit LD. By combining the sense circuits shown in FIGS. 11A and 12A, respectively, a four-level sense circuit MLR can be implemented. In the sense circuit MLR, the reference voltage levels $V_{R1}'$, $V_{R2}'$ and $V_{R3}'$ for the signal voltage V correspond to signal voltages making appearance in the load circuit upon reading of the memory cells storing $V_{cc}/6$, $V_{cc}/2$ and $5V_{cc}/6$, respectively.

The reference voltage is derived from the voltages $V_{Ra}'$ and $V_{Rb}'$ mentioned above in accordance with $$V_{Ri}' = a_i V_{Ra}' + (1-a_i) V_{Rb}' \qquad (9.1)$$

Since the voltage stored in the memory cell and the voltage inputted to the sense circuit MLR can be approximated by a linear relation, $a_i$ appearing in the expression (9.1) may be set as follows.

$$a_1 = \tfrac{2}{3}, \ a_2 = 0, \ a_3 = -\tfrac{2}{3} \qquad (9.2)$$

Through the resistive voltage division, $a_1 = \tfrac{2}{3}$ can be realized by using the voltage dividing resistors $R_3$ and $R_4$ in the arrangement shown in FIG. 11A, while $a_3 = -\tfrac{2}{3}$ is obtained equivalently by using the voltage dividing resistors $R_1$ and $R_2$ in the arrangement shown in FIG. 12A. The values of the individual resistors $R_1$, $R_2$, $R_3$ and $R_4$ are set as follows:

$$R_1 = R/(1-a_3) = 3R/5, \qquad (9.3)$$

$$R_2 = -a_3 R/(1-a_3) = 2R/5, \qquad (9.4)$$

$$R_3 = a_1 R = 2R/3, \qquad (9.5)$$

$$R_4 = (1-a_1)R = R/3 \quad (9.6)$$

where R represents a given resistance value.

Figure 17:
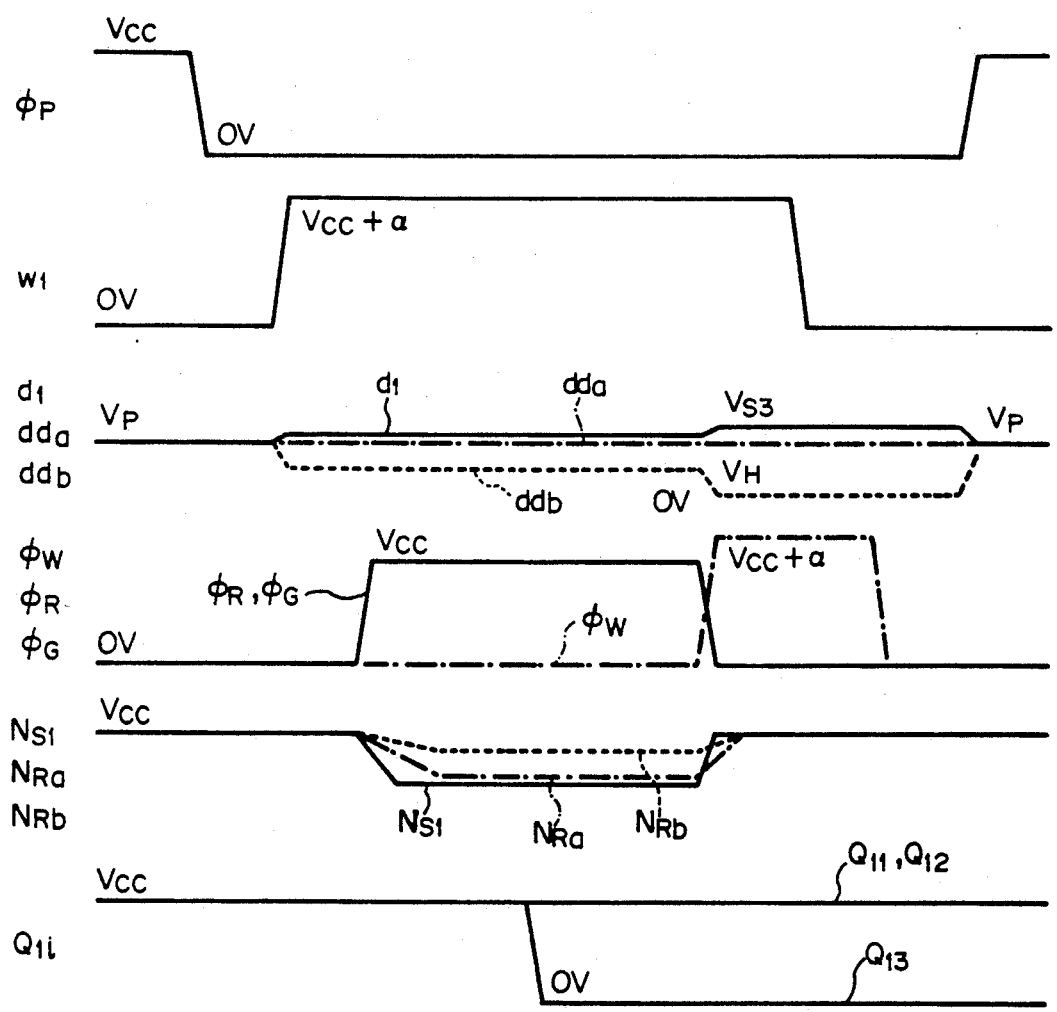
FIG. 17 is a waveform diagram for illustrating operation of the circuit shown in FIG. 16.

Read operation of the memory array shown in FIG. 16 will be described by reference to a waveform diagram shown in FIG. 17 which illustrates operation involved in reading out the memory cell $MC_{11}$ storing the voltage $V_3$ ($=2V_{cc}/3$). At first, the data line $d_1$ and the dummy data lines $dd_a$ and $dd_b$ precharged to a precharge voltage $V_p$ by the precharge circuit $PD_1$ and $Pdd_a$, $Pdd_b$, respectively, are set to a floating state by setting a control pulse $\phi_p$ to 0 (volt) to thereby turn off the precharge circuits. Subsequently, the word line $W_1$ is set to a high potential ($V_{cc}+\alpha$) to thereby allow the electric charge to be read out from the memory cell $MC_{11}$ onto the data line $d_1$. Needless to say, electric charges in the other memory cells connected to the word line $W_1$ are read out onto the respective data lines as well. At the same time, electric charges in the dummy cells $DC_a$ and $DC_b$ are read out onto the dummy data lines $dd_a'$ and $dd_b'$ respectively. Next, control pulses $\phi_R$ and $\phi_G$ are risen to the level $V_{cc}$. The voltage signals making appearance on the data line $d_1$ as well as the dummy data lines $dd_a$ and $dd_b$ are converted into currents by the signal transfer circuitries $DS_1$ as well as $DDS_a$ and $DDS_b$, which currents are then converted into voltages by the load circuitries $LD_1$ as well as $DLD_a$ and $DLD_b$, respectively. The voltage $V_S'$ appearing across the load circuitry $LD_1$ is inputted to an input terminal $N_{S1}$ of the multiple-level sense circuit $MLR_1$. On the other hand, the voltages $V_{Ra}'$ and $V_{Rb}'$ appearing across the load circuits $DLD_a$ and $DLD_b$ are applied to input terminals $N_{Ra}$ and $N_{Rb}$ common to a plurality of multiple-level sense circuits MLR ($MLR_1$, ..., $MLR_q$). In the multiple-level sense circuits, these voltage signals are applied to the voltage dividing resistors $R_1$, ..., $R_4$ through the emitter-followers, respectively. Through the comparison performed by the voltage comparator $VCP_i$ ($i=1, 2, 3$), a signal $Q_{1i}$ ($i=1, 2, 3$) representing the discriminative identification of the signal $V_S'$ relative to the reference level $V_{Ri}'$ ($i=1, 2, 3$) is obtained. After the data having discriminatively been determined by the multiple-level sense circuit MLR, the control pulse $\phi_R$ is lowered to 0 (volt) to turn off the signal transfer circuits DS as well as $DDS_a$ and $DDS_b$.

The output $Q_i$ of the multiple-level sense circuit is transferred to the multiple-level supply circuit MLW from which one of the four potential levels corresponding to the signal $Q_i$ is outputted to rise the control pulse $\phi_W$ to the level ($V_{cc}+\alpha$), whereby the output level of the multiple-level supply circuit MLW is transferred to the data line d via the signal transfer circuitries $DS_1$, ..., $DS_q$ and rewritten in the memory cell MC by lowering the potential on the word line W to 0 (volt). At the same time, the ground potential of 0 (volt) and the intermediate voltage $V_H$ are transmitted to the dummy data lines $dd_a$ and $dd_b$ through the signal transfer circuitries $DDS_a$ and $DDS_b$. Subsequently, the control pulse $\phi_p$ is changed over to the level $V_{cc}$ to thereby allow the data line d and the dummy data lines $dd_a$ and $dd_b$ to be precharged to the precharge voltage $V_P$ by the precharge circuits PD and $Pdd_a$ and $Pdd_b$, respectively.

In case the one-transistor/one-capacitor type memory cell is employed, the signal making appearance on the data line reflects a change in the potential on the data line which is brought about by distribution of the charge stored in the capacitor of the memory cell onto the capacitance of the data line. Consequently, magnitude of the signal appearing on the data line is affected by deviations or variances in the capacity of the memory cells and that of the data line which are attributable to process-related variations. In the memory array according to the present invention, the reference level for comparison is derived from the reference signal obtained by reading the charge from the dummy cell onto the dummy data line. Consequently, the reference level for comparison is equally affected by variances in the capacities of the dummy cells and the dummy data lines. Accordingly, by matching the electric characteristics between the memory cell and the dummy cell and between the data line and the dummy data line, the influence of these variances can be canceled out.

In the case of the instant embodiment, the dummy data lines $dd_a$ and $dd_b$ are shared by q data lines, wherein q multiple-level sense circuits are connected to the data lines while only one multiple-level sense circuit is connected to the data lines. These connections are realized through the medium of the data transfer circuitries DS to isolate the parasitic capacitance of the multiple-level sense circuits MLR and others from those of the data lines and the dummy data lines. By virtue of this arrangement, it can easily be established to match the electric characteristics of the data lines with those of the dummy data lines.

Although two dummy data lines are required in the memory array according to the instant embodiment of the invention, the size thereof can be reduced due to the sharing of the dummy data lines by a plurality of data lines. Further, because the inputting of the signals $V_{Ra}'$ and $V_{Rb}'$ appearing on the data lines and the dummy data lines to the plurality of multiple-level sense circuits brings about substantially no increase in the parasitic capacitances of the data lines and the dummy data lines, the signal voltage can be set at a high value to ensure the read operation with an improved S/N ratio.

It is sufficient that the reference signals appearing on the dummy data lines correspond to two different known levels. The constants involved in the circuit design of the multiple-level sense circuit can be determined in accordance with the two different levels mentioned above. For this reason, the potential level of the charge stored in the dummy cell can arbitrarily be set even with the same storage capacity of the dummy cell as that of the memory cell. By utilizing this potential straightforwardly in other circuitries, it is unnecessary to provide any additional voltage generating circuit for generating the potential to be utilized in the other circuitries. Since the potential levels of the dummy cells are selected to be 0 (volt) and $V_{cc}/2$, the voltage $V_{Rb}'$ applied to the input terminal $N_{Rb}$ can straightforwardly be used as the reference voltage $V_{R2}'$, as the result of which the multiple-level sense circuit MLR can be implemented in a much simplified structure. Since $a_3 = -\frac{2}{3}$ for $a_1 = \frac{2}{3}$, the memory array shown in FIG. 16 can be realized by a combination of the structures shown in FIGS. 10A and 11A although it is impossible with the combination of the arrays shown in FIG. 10B and FIG. 11B.

Although the dummy cell $DC_a$, $DC_b$ shown in FIG. 16 is of a same structure as the memory cell MC, the former has no resetting transistor connected thereto. The quantity of electric charge stored in the dummy cell $DC_a$ destined to store the ground potential is substantially insusceptible to fluctuation. In contrast, electric charge leaks from the dummy cell $DC_b$ which is destined to store the potential of intermediate level. Accordingly, there arises a possibility that the reference voltages appearing on the dummy data lines are deviated from the desired values, incurring eventually error in the reference levels for comparison and hence erroneous identification or detection of the data. This problem an be readily solved by selecting the precharge voltage $V_P$ as the intermediate potential level $V_H$ and by using the reference voltage making appearance on the dummy data line $dd_b$ without reading out the potential from the dummy cell $DC_b$. However, in order to balance the capacitance of the data line d with that of the dummy data line $dd_b$, it is preferred to connect the dummy cell $DC_b$ as described above. In this case, the threshold voltage of the transistor is set sufficiently high to prevent the charge from being read out from the dummy cell $DC_b$ even when word line W is set to high potential. This can be accomplished by partially thickening an oxide film underlying a gate electrode or changing an impurity density in a channel region of the transistor constituting the dummy cell $DC_b$.

Figure 18:
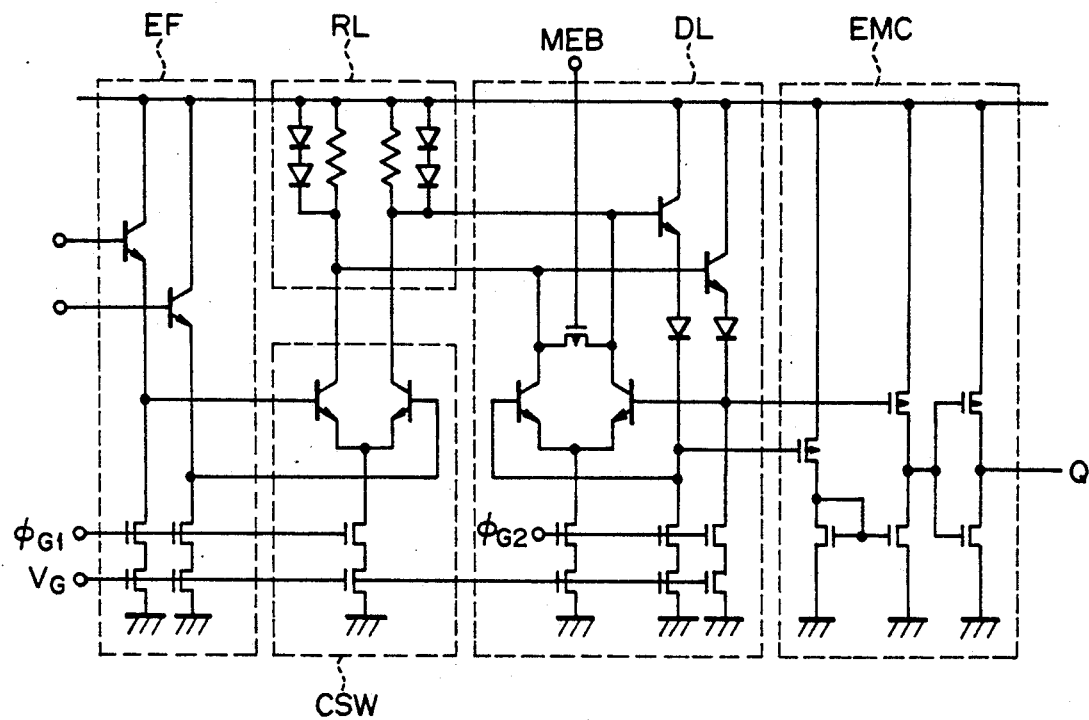
FIG. 18 shows an exemplary circuit configuration of a voltage comparator employed in the multiple-level sense circuit shown in FIG. 16.

FIG. 18 shows an exemplary circuit configuration of the voltage comparator VCP constituting a part of the multiple-level sense circuit shown in FIG. 16. As can be seen from FIG. 18, the voltage comparator VCP is composed of five blocks, i.e. an emitter-follower EF, a current switch CSW, a load circuitry RL, a latch circuitry DL and a level conversion circuitry EMC. The current switch CSW is constituted by a differential amplifier including a pair of emitter-coupled bipolar transistors and serves for amplification in opposite phase by using the load circuitry RL as a load. The load circuitry RL is constituted by a load resistor and a voltage-swing limiting diode. The latch circuitry DL is constituted by an emitter-follower and a differential amplifier to serve for positive feedback amplification by using the load circuitry RL as a load for thereby holding the data. The level conversion circuitry EMC is implemented in the form of a current-mirror type level conversion circuit for converting a signal of ECL level to that of CMOS level. In FIG. 18, $V_G$ designates a DC voltage which defines a bias voltage for the eimitter-follower EF, the current switch CSW and the latch circuitry DL.

By changing over the control pulse $\phi_{G1}$ to a high potential, the emitter-follower operates to input a voltage to the current switch CSW. By setting a control signal MEB at a low potential, signal comparison is performed through cooperation of the current switch CSW and the load circuitry RL. Subsequently, when a control pulse $\phi_{G2}$ is set to a high potential with $\phi_{G1}$ set low, the latch circuit DL is put into operation to effectuate the positive feedback amplification, whereby the result of comparison performed by the current switch CSW is detected. At the same time, output signal makes appearance at the output terminal through the level conversion circuitry EMC.

Figures 19A, 19B:
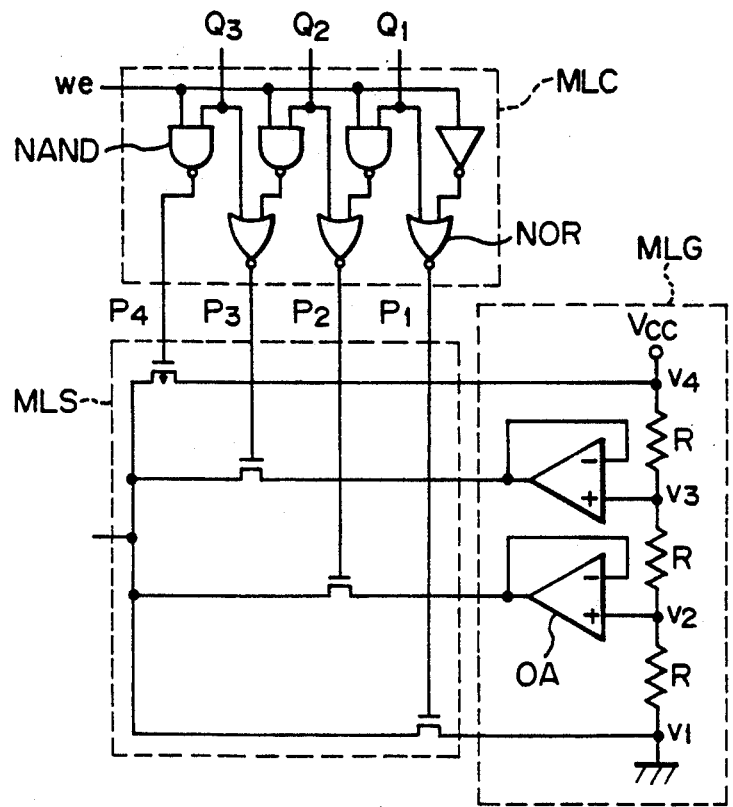
FIG. 19A shows an exemplary circuit configuration of a multiple-level supply circuit employed in the memory array shown in FIG. 16.
FIG. 19B shows a conversion table for illustrating operation of the circuit shown in FIG. 19A.

FIG. 19A shows an exemplary circuit configuration of the multiple-level supply circuit MLW shown in FIG. 16, which circuit functions to output one of four voltage levels of $V_1=0$ (volt), $V_2=V_{cc}/3$, $V_3=2V_{cc}/3$, $V_4=V_{cc}$. The multiple-level supply circuit MLW is constituted by a logic circuitry MLC for converting multiple-level data $Q_1$, $Q_2$ and $Q_3$ representing physical quantities into four selecting pulses $P_1$, $P_2$, $P_3$ and $P_4$, a changing-over circuitry MLS for selecting one of the four levels in accordance with the selecting pulses and a voltage generator MLG for supplying four levels.

The logic circuit MLC is constituted by three NAND gates, three NOR gates and an inverter. The data $Q_1$, $Q_2$, $Q_3$ representing physical quantities are the signals resulting from the multiple-level identification or detection in the restoring operation while they are data inputted from the input/output line DQ through the switch SWY in the write operation. From the signals $Q_1$, $Q_2$ and $Q_3$, the logic circuit MLC generates the selecting pulses $P_1$, $P_2$, $P_3$ and $P_4$ in accordance with a truth table shown in FIG. 19B. The signal WE serves to select the multiple-level supply circuit MLW. In the stand-by state, the signal WE is "L", the output $P_4$ of the logic circuit MLC is "H", and the outputs $P_1$, $P_2$ and $P_3$ thereof are "L", respectively.

The change-over circuit MLS is constituted by four MOS transistors and operates as a switch which is controlled by the selecting pulses $P_1$, $P_2$, $P_3$ and $P_4$. The change-over circuit MLS operates to change over the four voltage levels supplied from the voltage generator MLG. The output of the change-over circuit MLS is sent out onto the data line d. In the stand-by state, the output terminal of the switch circuitry MLS assumes a high impedance state.

The voltage generator MLG is constituted by three resistors R and two operation amplifiers OA. The source voltage $V_{cc}$ is divided by the three resistors R into voltage values of $V_2=V_{cc}/3$ and $V_3=2V_{cc}/3$. The divided voltage is then outputted through a voltage follower constituted by the operation amplifier OA. Since the resistors R serve to divide the source voltage $V_{cc}$ into three equal parts, it is only necessary for these voltage dividing resistors to present a high accuracy ratio of resistance values for the voltage division. So far as this requirement is met, the accuracy of the resistance values of the individual resistors themselves may be low. Further, the resistor may be replaced by a non-linear element and thus can be replaced by a MOS transistor connected in a diode fashion.

Figure 20:
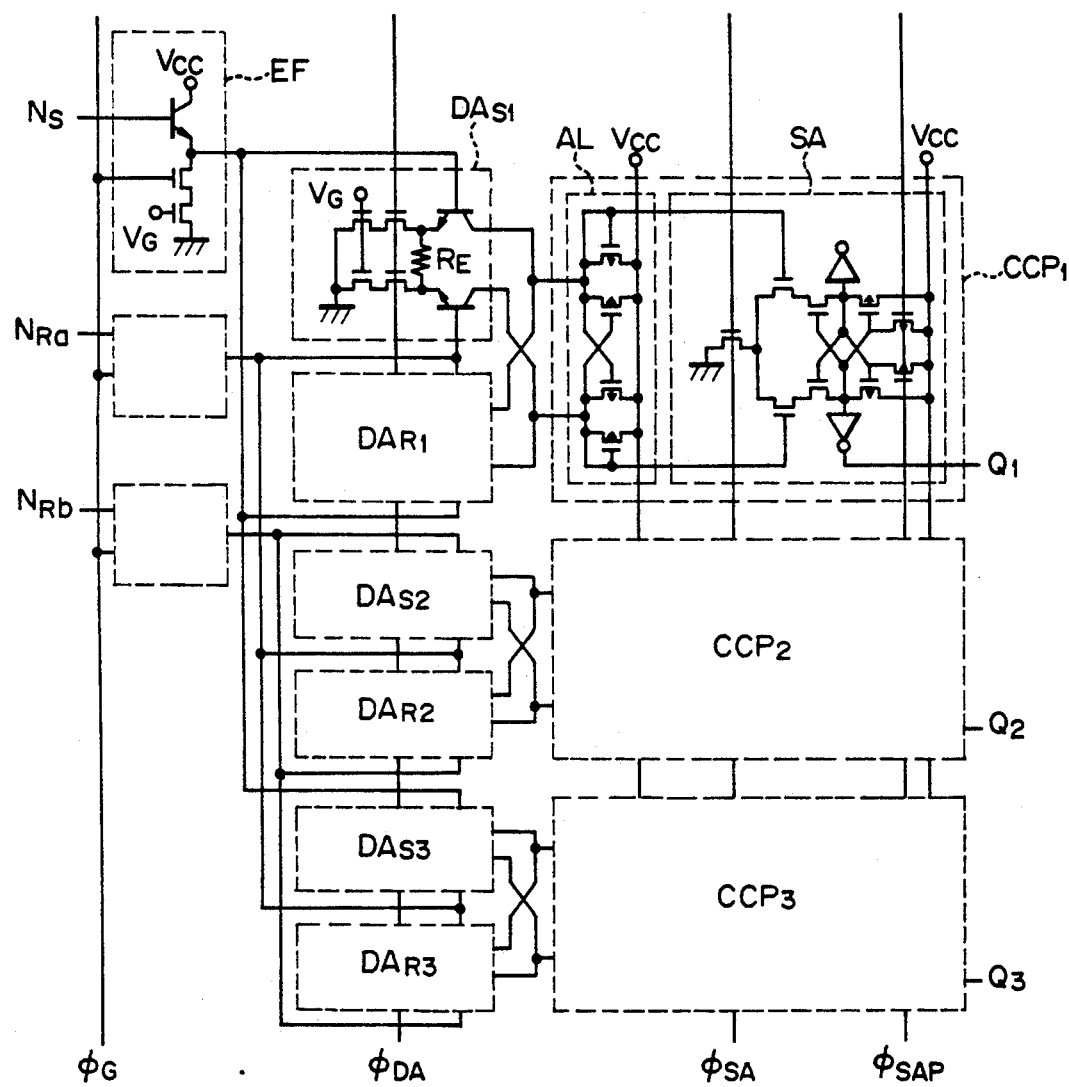
FIG. 20 shows another exemplary circuit configuration of the multiple-level sense circuit in which voltage-to-current converters are employed.

FIG. 20 shows another exemplary circuit configuration of the multiple-level sense circuit MLR. On the basis of the circuit arrangement shown in FIG. 15, the multiple-level sense circuit MLR shown in FIG. 20 is composed of three emitter followers EF, differential amplifiers $DA_{Si}$ and $DA_{Ri}$, and a current comparator $CCP_i$. The multiple-level sense circuit shown in FIG. 20 can replace the one shown in FIG. 16 in implementing a semiconductor multiple-level memory.

Each of the differential amplifiers $DA_{Si}$ and $DA_{Ri}$ is constituted by a pair of emitter-coupled transistors having an emitter resistor $R_E$ and serves as a linear amplifier rather than a switch. The transconductances $G_{Si}$ and $G_{Ri}$ of the differential amplifiers are determined by the respective emitter resistors $R_E$ representing corresponding weights. As shown by the expression (8.1), when the transconductance of the differential amplifier $DA_{Si}$ is represented by G, the transconductance of the differential amplifier $DR_{Ri}$ is given by $$G_{Ri}=(1-a_i)G \qquad (13.1)$$

As in the case of the multiple-level sense circuit shown in FIG. 16, the values $a_i$ of the weights for the signal are as follows:

$$a_1=\tfrac{2}{3}, a_2=0, a_3=-\tfrac{2}{3} \qquad (13.2)$$

Accordingly, the emitter resistors RE of the differential amplifiers $DA_{Si}$ and $DA_{Ri}$ are selected such that the following conditions are satisfied.

$$G_{R1}=G/3, \ G_{R2}=G, \ G_{R3}=5G/3 \qquad (13.3)$$

The current comparator $CCP_i$ is composed of an active load AL including four PMOS transistors and a CMOS differential amplifier SA which functions as a voltage comparator.

Read operation is performed in a manner described below. In the stand-by state, the control pulses $\phi_G$, $\phi_{DA}$ and $\phi_{SA}$ are set at a low potential level to thereby hold the emitter-follower, the differential amplifiers $Da_{Si}$ and $DA_{Ri}$ and the CMOS differential amplifiers SA of the current comparators $CCP_i$ in the off or nonconductive state, while the pulse $\phi_{SAP}$ is set to a potential level to precharge the output terminal of the CMOS differential amplifier SA. By setting the control pulse $\phi_G$ to a high level, the signal $V_S'$ and the reference signals $V_{Ra}'$ and $V_{Rb}'$ applied to the input terminals $N_S$, $N_{Ra}$ and $N_{Rb}$ from the signal transfer circuitry DS and the load circuitry LD are transmitted to the differential amplifiers $DA_{Si}$ and $DA_{Ri}$. Subsequently, by setting high the control pulse $\phi_{DA}$, the differential amplifiers $DA_{Si}$ and $DA_{Ri}$ are put into operation, resulting in that current flows through the active load AL incorporated in the current comparator $CCP_1$. The difference component between the output currents of the differential amplifiers $DA_{Si}$ and $DA_{Ri}$ assumes a value equal to a product resulting from multiplication of the difference component between the input voltages with the transconductance determined by the emitter resistance $R_E$. Both the differential amplifiers $DA_{Si}$ and $DA_{Ri}$ have the output terminals connected in common so that a sum of the output currents from both amplifiers $DA_{Si}$ and $DA_{Ri}$ can be obtained. This sum or differential current is converted into a voltage by the active load AL. By setting high the control pulses $\phi_{SAP}$ and $\phi_{SA}$, the CMOS differential amplifier SA operates to amplify the differential voltage signal resulting from the current-to-voltage conversion by the active load AL. The signal appearing at the output terminal of the differential amplifier SA is outputted through the inverter. In this conjunction, the inverter having the output terminal opened is to serve for the parasitic capacitance matching. After the potential difference appearing at the output terminal of the inverter becomes sufficiently high to allow the data to be identifeid, the control pulses $\phi_G$ and $\phi_{DA}$ are set low, which results in that the signal which represents the data identified and which turns off the differential amplifiers $DA_{Si}$ and $DA_{Ri}$ is transmitted to the multiple-level supply circuit MLW. Upon completion of memory cell restoring operation, the control pulses $\phi_{SAP}$ and $\phi_{SA}$ are set to low potential level. Now, the memory array resumes the stand-by state.

The abovementioned active load AL is constituted by a combination of two PMOS current-mirror transistors and exhibits a high equivalent resistance to the differential component while presenting a low equivalent resistance to the in-phase components. Consequently, voltage fluctuation due to in-phase components of the input current is negligible, while the differential component is converted into a high voltage. By employing the differential amplifiers in the multiple-level sense circuit for obtaining the weighted sum, the signal component can be sufficiently amplified to enhance the S/N ratio. When difference between the input current is large, the two transistors are cut off with the differential equivalent resistance becoming small, whereby the voltage swing can be limited as well. Further, in the CMOS differential amplifier SA, the input terminals are isolated from the output terminal, whereby the input signal is protected against variation due to the amplifying operation. Accordingly, there arises no fear that the bipolar transistors of the differential amplifiers $DA_{Si}$ and $DA_{Ri}$ should be driven into saturation. Thus, diodes or the like otherwise required to be added can be spared.

Figure 21:
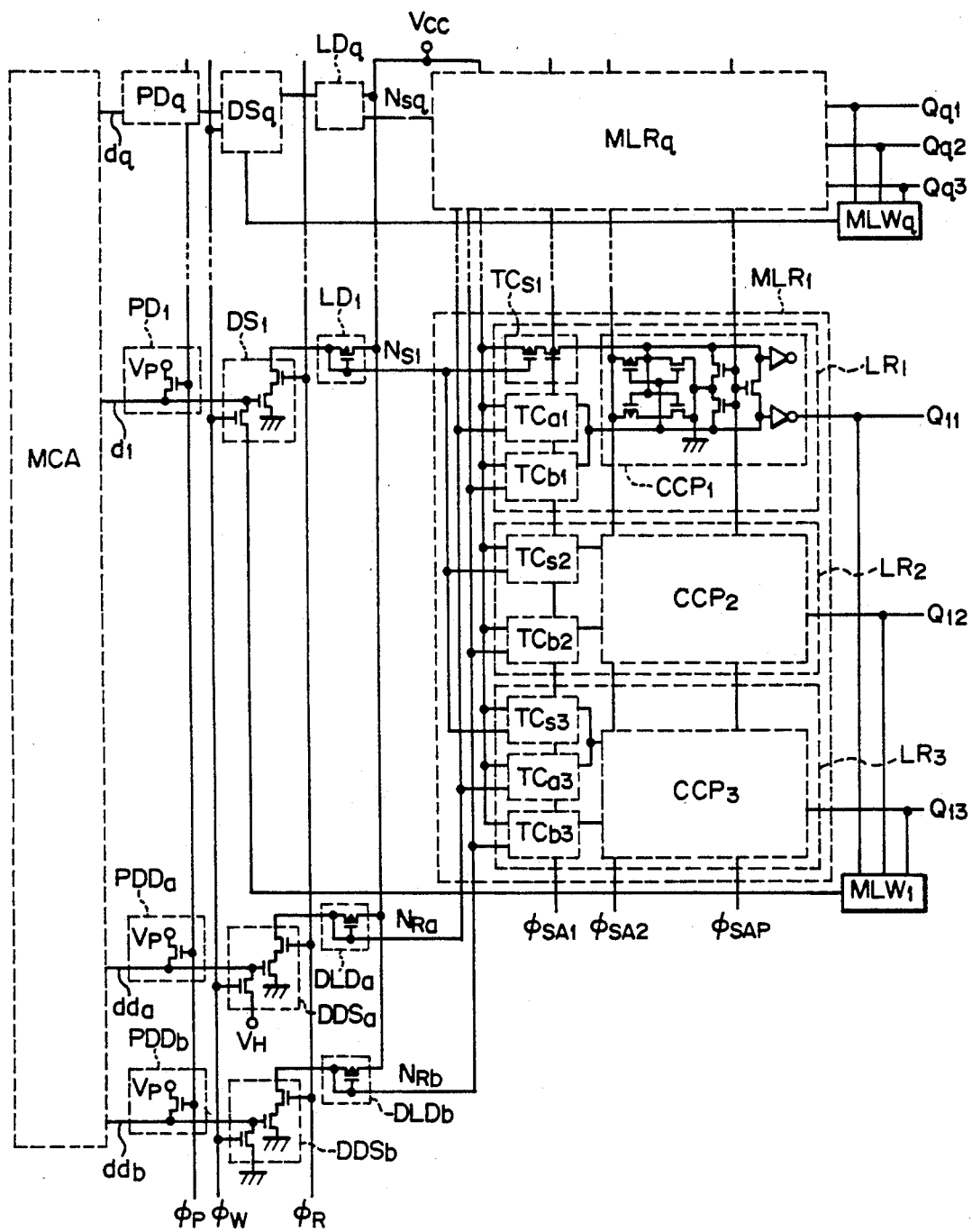
FIG. 21 shows still another embodiment of the multiple-level sense circuit which is based on the structures shown in FIGS. 12 and 13.

FIG. 21 shows still another embodiment of the multiple-level sense circuit MLR ($MLR_1$, ... $MLR_q$) which is based on the structures shown in FIGS. 12 and 13. The multiple-level sense circuit MLR according to the instant embodiment includes neither bipolar transistors nor resistors but is constituted by using CMOS transistors. The memory array MCA shown in FIG. 21 is implemented in the, arrangement similar to that shown in FIG. 16, wherein there are provided in connection with the data lines d ($d_1$, ..., $d_q$) and the dummy data lines $dd_a$ and $dd_b$ the precharge circuits PD ($PD_1$, ..., $PD_q$) and $PDD_a$, $PDD_b$, the signal transfer circuitries DS ($DS_1$, ..., $DS_q$) and $DDS_a$; $DDS_b$ and the load circuits LD ($LD_1$, ..., $LD_q$) and $DLD_a$; $DLD_b$. In association with the data lines d, there are provided the multiple-level sense circuits MLR ($MLR_1$, ..., $MLR_q$) having the respective input terminals $N_S$ ($N_{S1}$, ..., $N_{Sq}$) to which the signal transfer circuitries DS are connected via the respective load circuitries LD. Further, there are connected to the input terminals $N_{Ra}$ and $N_{Rb}$ common to q multiple-level sense circuits MLR the signal transfer circuitries $DDS_a$ and $DDS_b$ via the load circuitries $DLD_a$ and $DLD_b$, respectively. Additionally, multiple-level supply circuits MLW ($MLW_1$, ..., $MLW_q$) are provided and connected to the multiple-level sense circuit DS and the signal transfer circuitries DS. It will be seen that the memory array shown in FIG. 21 is of a same arrangement as that shown in FIG. 16 except for the arrangements of the load circuitries LD and the multiple-level sense circuits MLR. Each of the load circuitries LD and $DLD_a$; $DLD_b$ is constituted by a PMOS transistor having a diode connected thereto.

The multiple-level sense circuit MLR is composed of three sense circuitries each constituted by a voltage-to-current converter TCC ($TC_{Si}$, $TC_{ai}$, $TC_{bi}$) and a current comparator $CCP_i$. The current comparator $CCP_i$ is composed of common input/output flip-flop type differential amplifier, a precharging NMOS transistor and two inverters. The voltage-to-current converter TC is composed of a PMOS transistor having a gate connected as an input terminal and a source connected to the voltage source $V_{cc}$ and a PMOS transistor functioning as a switch. Let's represent the transconductances of the voltage-to-current converters $TC_{Si}$, $TC_{ai}$, $TC_{bi}$ by $G_{Si}$, $G_{ai}$, $G_{bi}$, respectively, whose values are determined by the ratios between gate width and gate length of the PMOS transistors constituting the voltage-to-current converters. As in the case of the embodiment shown in FIG. 16, the values $a_i$ weighting the signal are set as follows:

$$a_1=\tfrac{5}{3}, \ a_2=0, \ a_3=-\tfrac{5}{3} \qquad (14.1)$$

The weighting value $a_1$ is realized by $LR_1$ in accordance with the arrangement shown in FIG. 12. The transconductances of the individual voltage-to-current converters are defined as follows:

$$G_{S1}=G, G_{a1}=2G/3, G_{b1}=G/3 \quad (14.2)$$

where G represents a given transconductance value. Similarly, the weighting value $a_2$ is realized by $LR_2$. The transconductances have the following values:

$$G_{S2}=G, G_{a2}=0, G_{b2}=G \quad (14.3)$$

Accordingly, the voltage-to-current converter $TC_{a2}$ is rendered unnecessary and thus omitted from the memory array shown in FIG. 21. Since the weighting value $a_3$ is negative (minus), it is realized by $LR_3$ based on the arrangement shown in FIG. 13. The values of transconductances are as follows:

$$G_{S3}=3G/5, G_{a3}=2G/5, G_{b3}=G \quad (14.4)$$

Read operation is performed in a substantially same manner as in the case of the embodiment shown in FIG. 16 by operating the multiple-level sense circuit MLR as described below. In the stand-by state, the control pulse $\phi_{SA1}$ is set to a high potential level to thereby hold the voltage-to-current converter TC in the off or nonconductive state, while the control pulse $\phi_{Sa2}$ is set to a low potential level with the control pulse $\phi_{SAP}$ being set high to thereby precharge the input terminal of the current comparator $CCP_1$ to 0 (volt). After the signal $V_S'$ and the reference signal $V_{Ra}'$ and $V_{Rb}'$ are applied to the input terminals $N_S(N_{S1}, \ldots, N_{Sq})$, $N_{Ra}$ and $N_{Rb}$, the control pulse $\phi_{SA1}$ is set low to thereby allow the voltage-to-current converter TC to operate. Then, a current corresponding to the input voltage flows from the voltage-to-current converter TC to the current comparator $CCP_i$ in dependence on the transconductance of the converter TC. By setting low the control pulse $\phi_{SAP}$ to thereby turn off the precharging NMOS transistor, the sense circuit $LR_1$ operates as a source-grounded amplifier. When the signal voltage appearing across the input terminals of the current comparator $CCP_i$ becomes sufficiently high, the control pulses $\phi_{SR1}$ and $\phi_{SA2}$ are set high to thereby allow the current comparator $CCP_i$ to operate as a common input/output flip-flop type differential amplifier. The potential difference across the input terminals of type current comparator $CCP_i$ is amplified to $V_{cc}$ to prevent a rush current from flowing to the ground from the supply source $V_{cc}$. At this time, no amplified signal is fed back to the voltage-to-current converter TC. The result of detection is outputted through the inverter. The inverter having the output terminal opened is connected for the purpose of capacitance matching of the input terminal of the current comparator $CCP_i$. The output $Q_i(Q_{1i}, \ldots, Q_{qi})$ of the multiple-level sense circuit MLR is transferred to the multiple-level supply circuit MLW. Upon completion of the restoring operation, the control pulses $\phi_{SA2}$ is set low with the control pulse $\phi_{SAP}$ being set high, whereby the memory array is reset to the stand-by state.

Since the load circuitry LD is constituted by the PMOS transistor connected in a diode-like fashion, the output current of the signal transfer circuitry DS is converted nonlinearly to a voltage. Further, since the transconductance of the voltage-to-current converter TC is determined by the PMOS transistor, the input voltage undergoes nonlinear current conversion. Since the load circuitry LD and the voltage-to-current converter TC are connected in a current mirror configuration, the output current of the voltage-to-current converter TC bears linearity relative to the output current of the signal transfer circuitry. Since the arrangement now under consideration includes neither the bipolar transistors nor the resistors but is constituted only by the MOS transistors, the fabrication process is significantly facilitated. Further, because no area for isolation of the MOS transistor and the bipolar transistor is required at all, the chip area can be reduced as a whole.

In the case of the embodiments shown in FIGS. 16 to 20, both the bipolar transistor and the MOS transistor are employed. However, the memory array can be constituted only by using the MOS transistors without resorting to the use of the bipolar transistor. By way of example, the voltage comparator shown in FIG. 18 can be constituted by a current-mirror type CMOS differential amplifier. In that case, the level conversion circuit EMC shown in FIG. 18 is rendered unnecessary.

Figure 22:
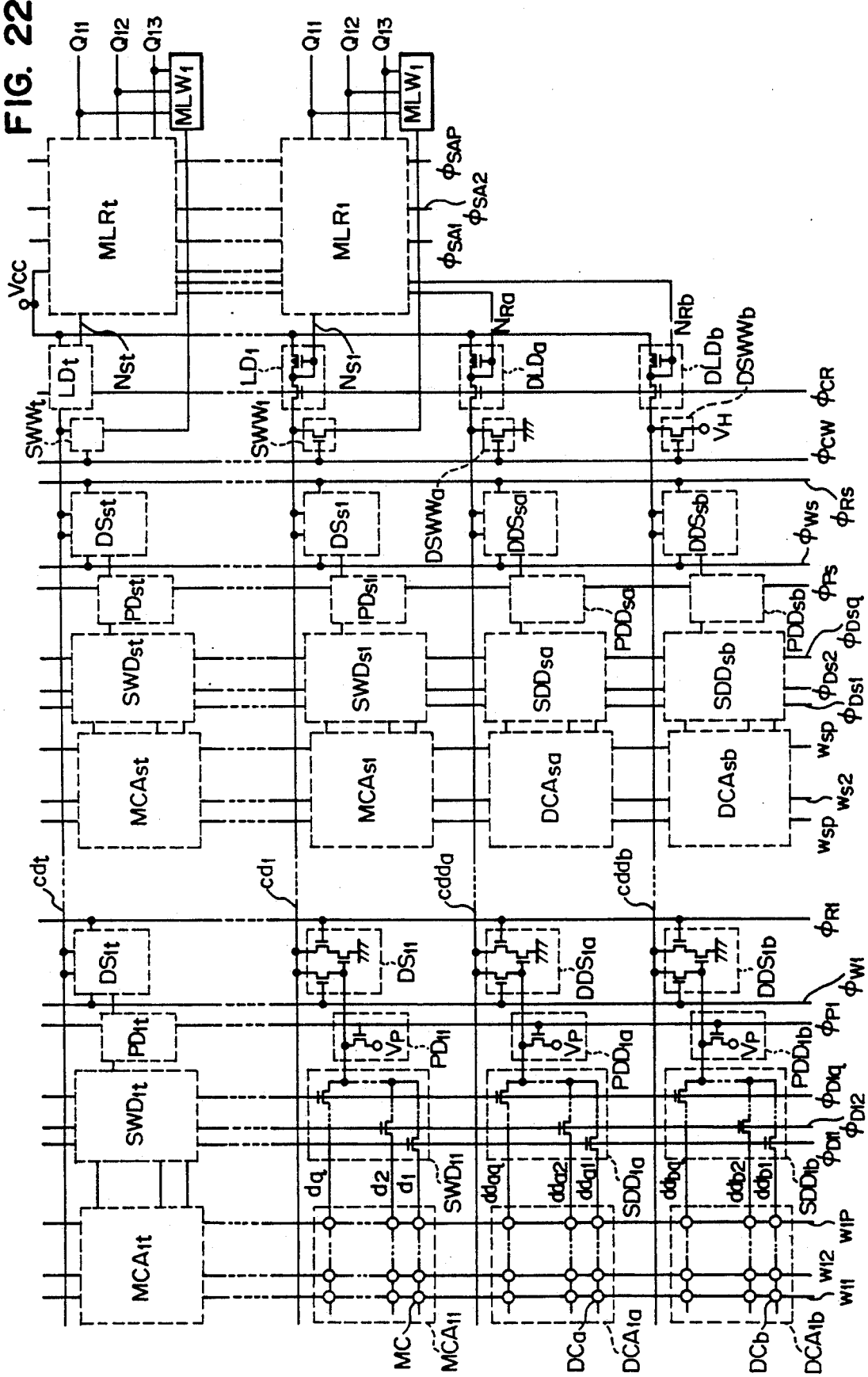
FIG. 22 is a diagram showing a memory array structure in which a multiple-level sense circuit and a multiple-level supply circuit are shared by a plurality of data lines.

FIG. 22 shows a further exemplary embodiment of the present invention in which the multiple-level sense circuit and the multiple-level supply circuit are shared by a plurality of data lines to thereby reduce the chip area and mitigate the layout pitch requirement. Signals read out simultaneously onto plural data lines are time-serially inputted to the multiple level sense circuit by a change-over switch to thereby allow the multiple-level sense circuit to be shared by the data signal. Disposed in parallel with the data lines is a global data line which exchanges signals with the plurality of data lines through the signal transfer circuitries. The multiple-level sense circuit and the multiple-level supply circuit are connected to the global data line so as to be shared by the plurality of data lines.

Disposed at cross-points or intersections between p word lines W ($W_{11}, \ldots, W_{1p}$ or $W_{s1}, \ldots, W_{sp}$) and q data line d ($d_1, \ldots, d_q$) are (p×q) memory cells MC, respectively, to constitute a memory array MCA ($MCA_{11}$ and others), whereon (s×t) memory arrays are disposed in a matrix-like array. The q data lines d of each memory array MCA are connected to the signal transfer circuitries DS ($DS_{11}$ and others) by way of switches SWD ($SWD_{11}$ and others). Further, the precharge circuits PD ($PD_{11}$ and others) are connected to the junctions between the switches SWD and the signal transfer circuitries DS. The global data lines cd ($cd_1, \ldots, cd_t$) are provided in parallel with the data lines d. By way of example, q data lines d of s memory arrays $MCA_{11}, \ldots, MCA_{1s}$ are connected to the global data line $cd_1$ via the switches $SWD_{11}, \ldots, SWD_{1s}$ and the signal transfer circuitries $DS_{11}, \ldots, DS_{1s}$, respectively. The global data lines cd are connected to the load circuitries LD ($LD_1, \ldots, LD_t$) and the input terminals $N_s$ ($N_{s1}, \ldots, N_{st}$) of the multiple-level sense circuitries MLR ($MLR_1, \ldots, MLR_t$). Further, the global data lines cd are connected to the output terminals of the multiple-level supply circuits MLW ($MLW_1, \ldots, MLW_t$) through switches SWW ($SWW_1, \ldots, SWW_t$).

As with the case of the memory arrays MCA, there are provided s dummy arrays $DCA_a$ ($DCA_{1a}, \ldots, DCA_{sa}$) each including (p×q) dummy cells DCA disposed at intersections between p word lines W and q dummy data lines $dd_a$ ($dd_{a1}, \ldots, dd_{aq}$) and s dummy arrays $DCA_b$ ($DCA_{1b}, \ldots, DCA_{sb}$) including (p×q) dummy cells $DC_b$ disposed at intersections or cross-points between p word lines W and q dummy data lines $dd_b$ ($dd_{b1}, \ldots, dd_{bq}$). The dummy arrays $DCA_a$ and $DCA_b$ are connected to the signal transfer circuitries $DDS_a$ ($DDS_{1a}, \ldots, DDS_{sa}$) and $DDS_b$ ($DDS_{1b}, \ldots, DDS_{sb}$) and the precharge circuitries $PDD_a$ ($PDD_{1a}, \ldots, PDD_{sa}$) and $PDD_b$ ($PDD_{1b}, \ldots, PDD_{sb}$) through switches $SDD_a$ ($SDD_{1a}, \ldots, SDD_{sa}$) and $SDD_b$ ($SDD_{1b}, \ldots, SDD_{sb}$), respectively. Disposed in parallel with the global data line cd are global dummy data lines $cdd_a$ and $cdd_b$ to which s signal transfer circuitries $DDS_a$ and $DDS_b$ are connected, respectively. The global dummy data lines $cdd_a$ and $cdd_b$ are connected to input terminals $N_{Ra}$ and $N_{Rb}$ common to t multiple-level sense circuitries MLR by way of load circuitries $DLD_a$ and $DLD_b'$ respectively. Additionally, the global dummy data lines $cdd_a$ and $cdd_b$ are connected to the ground potential of 0 (volt) and an intermediate potential $V_H$ through switches $DSWW_a$ and $DSWW_b$ respectively.

In the memory device shown in FIG. 22, the memory cells MC and the dummy cells $DC_a$ and $DC_b$ are all of a same structure and constituted by one-transistor/one-capacitor type cells, respectively.

Figure 23:
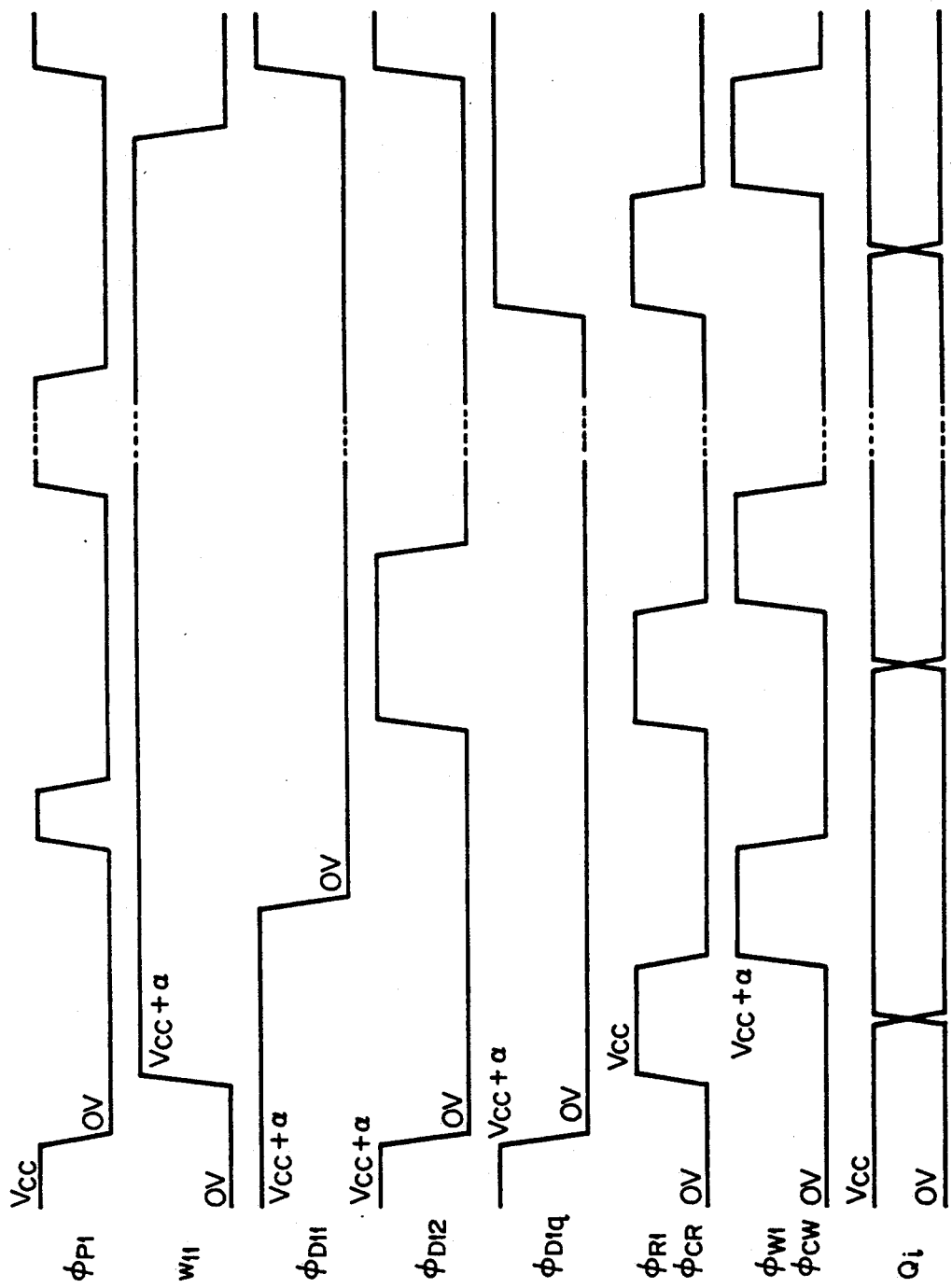
FIG. 23 is a waveform diagram for illustrating operation of the memory array shown in FIG. 22.

Now, referring to FIG. 23, memory reading operation will now be described on the assumption that data are to be need out from the memory cells MC connected to the word lines $W_{11}$. In the stand-by state, the control pulses $\phi_P(\phi_{P1}, \ldots, \phi_{Ps})$ are set to $V_{cc}$ to operate all the precharge circuit PD. Further, all the control pulses $\phi_D$ ($\phi_{D11}$ and others) for the switches SWD are set to high potential ($V_{cc} + \alpha$) to thereby turn on all the switches SD. Thus, the data lines d in whole memory array MCA and the dummy data lines $dd_a$ and $dd_b$ in the whole dummy data arrays $DCA_a$ and $DCA_b$ are precharged to the voltage $V_P$. Further, by setting high the control pulse $\phi_{CR}$ to $V_{cc}$ to turn on the load circuitries LD and $DLD_a$; $DLD_b$ for thereby set the global data line cd and the global dummy data lines $cd_a$ and $cd_b$ to a voltage lower than the source voltage $V_{cc}$ by a threshold voltage of the PMOS transistor.

At first, from a plurality of rows of memory arrays MCA, one row of memory arrays $MCA_{11}, \ldots, MCA_{1t}$ it is selected, whereon the control pulses $\phi_{P1}$, and $\phi_{D12}$, $\ldots$, and $\phi_{D1q}$ are set to 0 (volt) to thereby put the data line d to a floating state. At that time, the dummy data line $dd_a$ of the dummy array $DCA_{1a}$ as well as the dummy data line $dd_b$ of the dummy array $DCA_{1b}$ are set to the floating state. Next, the word line $W_{11}$ is set to a high potential level ($V_{cc} + \alpha$) to select one row of the memory cells MC from those disposed in a matrix-like array in the memory arrays $MCA_{11}, \ldots, MCA_{1t}$, to thereby allow electric charges to be read out from these memory cells MC onto the respective data lines. At the same time, data in one rows of the dummy cells in the dummy arrays $DCA_{1a}$ and $DCA_b$ are read out onto the dummy data lines $dd_a$ and $dd_b$, respectively.

At that time, by retaining the control pulse $\phi_{D11}$ at high level, the signals appearing on the data lines $d_1$ of the memory arrays $MCA_{11}, \ldots, MCA_{1t}$ are transmitted to the signal transfer circuitries $DS_{11}$ to $DS_{1t}$, respectively. Simultaneously, the reference signals appearing on the dummy data lines $dd_{a1}$ and $dd_{b1}$ in the dummy data arrays $DCA_{1a}$ and $DCA_b$ are also transmitted to the signal transfer circuitries $DDS_{1a}$ and $DDS_{1b}$, respectively. These signals are converted to currents by setting high the control pulse $\phi_{R1}$, as a result of which current can flow through the global data line cd and the global dummy data lines $ccd_a$ and $ccd_b$ from the load circuitries LD, $DLD_a$ and $DLD_b$. A voltage signal outputted from the load circuitry LD is applied to the input terminal $N_S$ of the multiple-level sense circuit MLR. Similarly, the reference signals $V_{Ra}'$ and $V_{Rb}'$ resulting from the voltage conversions by the load circuitries $DLD_a$ and $DLD_b$ are applied to the input terminals $N_{Ra}$ and $N_{Rb}$ which are common to t multiple-level sense circuits MLR. After data having been identified by the multiple-level sense circuits MLR, the control pulses $\phi_{R1}$ and $\phi_{CR}$ are set low to turn off the signal transfer circuitries $DS_{11}, \ldots, DS_{1t}, DDS_{1a}; DDS_{1b}$ and the load circuitries LD and $DLD_a$; $DLD_b$. The output Q ($Q_{1t}, \ldots, Q_{ti}$) of the multiple-level sense circuits MLR are transmitted to the respective multiple-level supply circuits MLW, whereupon one of four levels is outputted in dependence on the data supplied from the multiple-level supply circuit MLW. The control pulses $\phi_{CW}$ and $\phi_{W1}$ are set high to ($V_{cc} + \alpha$) to thereby turn on the switch SWW and the signal transfer circuitry DS serving as a switch, whereby the voltages outputted from the multiple-level supply circuits MLW are transmitted to the data lines of the memory arrays $MCA_{11}, \ldots, MCA_{1t}$, respectively. Simultaneously, the ground potential of 0 (volt) is transmitted to the dummy data line of the dummy array $DCA_{1a}$ via the switch $DSWW_a$ and the signal transfer circuitry $DDS_{1a}$. Further, the intermediate potential $V_H$ is transmitted to the dummy data line $dd_{b1}$ in the dummy array $DCA_{1b}$ via the switch $DSWW_b$ and the signal transfer circuitry $DDS_{1b}$. By setting low the control pulse $\phi_{D11}$, the potentials transmitted to the data lines $d_1$ of the memory arrays $MCA_{11}, \ldots, MCA_{1t}$ and the dummy data lines $dd_{a1}$ and $dd_{b1}$ of the dummy arrays $DCA_{1a}$ and $DCA_{1b}$ are held as they are. Subsequently, the control pulses $\phi_{WC}$ and $\phi_{W1}$ are set low to turn off the switches SWW and $DSWW_a$; $DSWW_b$ and the signal transfer circuitries DS and $DDS_{1a}$; $DDS_{1b}$. By setting the control pulse to $\phi_{P1}$ to $V_{cc}$, junctions between the switch SWD and the signal transfer circuitry DS, $SDD_a$ and $DDS_a$, and $SDD_b$ and $DDS_b$ are precharged by the precharge circuits PD, $PDD_a$ and $PDD_b$, respectively. Further, the control pulse a $\phi_{CR}$ are set high to $V_{cc}$ to thereby turn on the load circuitries LD and $DLD_a$; $DLD_b$. Then, the global data line cd and the global dummy data lines $cd_a$ and $cd_b$ are set to a voltage which is lower than the source voltage $V_{cc}$ by a threshold voltage of the PMOS transistor.

Nest, the control pulse $\phi_{D12}$ is set high to change over the switch SWD for performing the operation described above, as a result of which data read onto the data lines $d_2$ of the memory arrays $MCA_{11}, \ldots, MCA_{1t}$ it are detected, whereon the data lines $d_2$ are restored to the potentials corresponding to the data detected. Similar operation is repeated up to the control pulse $\phi_{D12}$. The signals read out onto the data lines $d_q$ are discriminatively detected, whereon corresponding potentials are transmitted to the data lines $d_q$. Thereafter, the word line $W_{11}$ is reset to 0 (volt). Thus, the potentials on the individual data lines of the memory arrays $MCA_{11}, \ldots, MCA_{1t}$ are stored in the respective memory cells, whereupon restoring operation is completed. Simultaneously, the dummy cell $DC_a$ in the dummy array $DCA_{1a}$ from which the reference data has been read out is set to the ground potential. Similarly, the dummy cell in the dummy array $DCA_{1b}$ from which the data has been read out is also restored to the ground potential. Thereafter the control pulses $\phi_{CW}$ and $\phi_{W1}$ are set low with the control pulse $\phi_{P1}$ being set to $V_{cc}$, while the control pulses $\phi_{D11}, \ldots, \phi_{D1(q-1)}$ for the switches SWD are set to the high potential ($V_{cc} + \alpha$) with the control pulse $\phi_{CR}$ being set to $V_{cc}$. The stand-by state is thus resumed.

The multiple-level sense circuit is complicated in the configuration and requires larger area for implementation when compared with a conventional sense amplifier of DRAM. However, by virtue of the arrangement that the multiple-level sense circuit is shared by a plurality of data line, the number of the sense circuits can be decreased with the area occupied thereby being correspondingly reduced. Further, the layout can be facilitated because the pitch for q data lines is sufficient. Besides, since the number p of the memory cells per data line can be decreased with the capacitance of the data line being thereby reduced, there can be realized a high-speed read operation with an improved S/N ratio.

Figure 24:
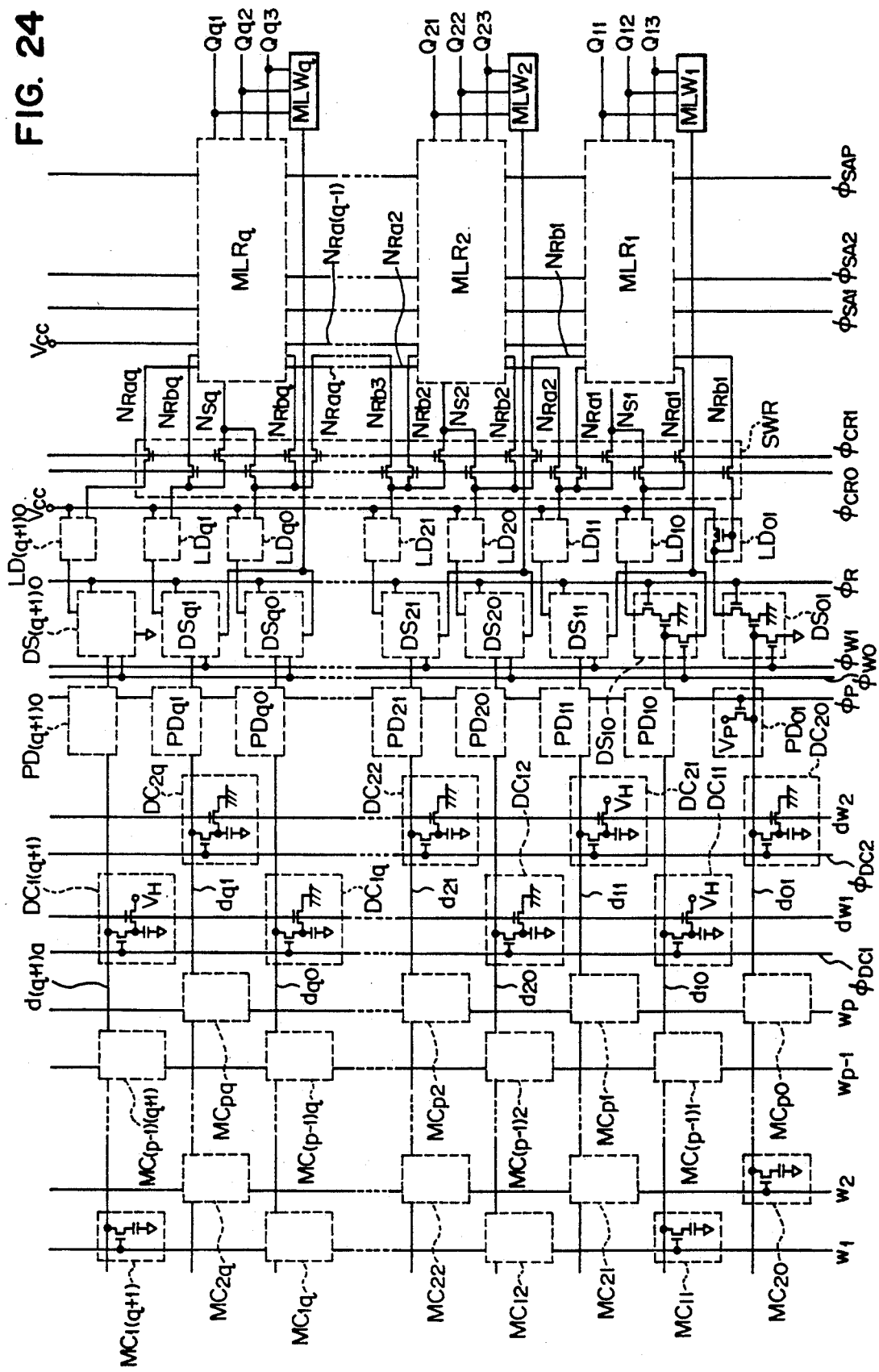
FIG. 24 is a diagram showing a memory array of a folded data-line arrangement.

FIG. 24 shows still another embodiment of the invention in which the data lines and the dummy data lines are disposed alternately. Since two dummy data lines are required, each dummy line is shared by a pair of data lines. The data lines include pairs of lines $D_{10}$ and $D_{11}$, $D_{20}$ and $D_{21}$, ..., $D_{q0}$ and $D_{q1}$, wherein data lines $D_{01}$ and $D_{(q+1)0}$ are disposed at opposite sides, respectively. In each pair of the data lines, either one of the lines serves as the data line on which a signal is read out with the other serving as the dummy data line. Lines $d_{01}$ and $d_{(q+1)0}$ serve as the dummy data lines. Memory cells MC ($MC_{11}$ and others) are disposed at intersections between the word lines W ($W_1, \ldots, W_p$) and every other one of the data lines. More specifically, the memory cells $MC_{11}, \ldots, MC_{1(q+1)}$ selected by the word line $W_1$, for example, are connected to the data lines $d_0$ ($d_{10}, \ldots, d_{(q+1)0}$), while the memory cells $MC_{20}, \ldots, MC_{2q}$ selected by the word line $W_2$ are connected to the data line $d_1$ ($d_{01}, \ldots, d_{q1}$). The memory cells $MC_{20}$, $MC_{40}$, ..., $MC_{p0}$ and $MC_{1(q+1)}$, $MC_{3(q+1)}, \ldots, MC_{(p-1)(q+1)}$ connected to the data lines $DW_1$ and $DW_2$ are provided for the parasitic capacitance matching with the other data lines and no data are stored in these memory cells. Dummy word lines $DW_1$ and $DW_2$ are disposed in parallel with the word line W, wherein dummy cells $DC_{11}, \ldots DC_{1(q+1)}$ are disposed at cross-points between the dummy word lines $DW_1$ and the data lines $d_0$, respectively, while dummy cells $DC_{20}, \ldots DC_{2q}$ are disposed at intersections between the dummy data lines $DW_2$ and the data lines $d_1$, respectively. In other words, one dummy cell is connected to each of the data lines. The dummy cell is implemented in the form of a one-transistor/one-capacitor type memory cell provided with a resetting transistor. The dummy cells $DC_{11}, \ldots, DC_{1(q+1)}$ are controlled by a control pulse $\phi_{DC1}$, while the dummy cells $DC_{20}, \ldots, DC_{2q}$ are controlled by a control pulse $\phi_{DC2}$. The resetting transistors are connected to the ground potential and the intermediate potential $V_H$ alternately on the paired data-line basis. In the case of the array shown in FIG. 4, q represents an even number. The following description is made on this assumption. Thus, the dummy cells $DC_{20}$, $DC_{12}$, $DC_{22}$, ..., $DC_{1q}$, $DC_{2q}$ are destined for storing the ground potential (these dummy cells will hereinafter by denoted generally by $DC_b$), while the dummy cells $DC_{11}$, $DC_{21}, \ldots, DC_{1(q-1)}$, $DC_{2(q-1)}$, $DC_{1(q+1)}$ are destined for storing the intermediate potential (these dummy cells will hereinafter be denoted generally by $DC_a$).

The data lines are connected to the precharge circuits PD ($PD_{10}$ and others) and to the load circuitries LD ($LD_{10}$ and others) via the signal transfer circuitries DS ($DS_{10}$ and others), respectively. In correspondence to the paired data lines $d_0$ and $d_1$, there are provided the multiple-level sense circuits MLR ($MLR_1, \ldots, MLR_q$) and the multiple-level supply circuits MLW ($MLW_1, \ldots, MLW_q$). The multiple-level sense circuit MLR are connected to the load circuitry LD through the corresponding data line pair and the data lines disposed at opposite sides thereof, i.e. through four data lines and six MOS transistors incorporated in a change-over switch circuitry SWR controlled by the control pulses $\phi_{CR0}$ and $\phi_{CR1}$. The multiple-level supply circuit MLW is connected to the signal transfer circuitry DS of the associated paired data lines. The precharge circuit PD, the signal transfer circuit DS, the load circuitry LD, the multiple-level sense circuit MLR and the multiple-level supply circuit MLW are, respectively, of the same structures as the corresponding ones shown in FIG. 21. It should however be mentioned that the signal transfer circuits $DS_{01}$ and $DS_{(q+1)0}$ are not connected to the multiple-level supply circuit MLW but connected to a fixed potential level.

Read operation will now be described in conjunction with the memory cells $MC_{11}, \ldots, MC_{1(q-1)}$ connected to the word line $W_1$, by way of example. First, the data line precharged to a precharge voltage $V_P$ by the precharge circuit PD is set to a floating state by lowering the level of the control pulse $\phi_P$ to 0 (volt) to thereby turn off the precharge circuit PD. Further, by setting low the control pulse $\phi_{DC2}$, the potentials $V_H$ and 0 (volt) are stored in the dummy cells $DC_a$ and $DC_b$, respectively. The word line $W_1$ is then set to $(V_{cc}+\alpha)$ to thereby allow the electric charges at the memory cells $MC_{11}, \ldots, MC_{1(q+1)}$ to be read out onto the data lines $d_0$. At the same time, the dummy word lines $DW_2$ is set to the potential $(V_{cc}+\alpha)$ to cause electric charges to be read out from the dummy cells onto the data lines $d_1$, which is used as the dummy data line. Since the dummy cells $DC_{20}$, $DC_{22}, \ldots DC_{2q}$ represent those denoted by $DC_b$ as defined above while the dummy cells $DC_{21}$, $DC_{23}, \ldots, DC_{2(q-1)}$ represent those denoted by $DC_a$, it can be said that the signal charges of the dummy cells $DC_b$ are read out onto the data lines $d_{01}, d_{21}, \ldots, d_{q1}$, while signal charges of the dummy cells DC4a are read out onto the data lines $d_{11}, d_{31}, \ldots, d_{(q-1)1}$. By setting high the control pulse $\phi_R$, the signals appearing on the data lines are converted to the current through the signal transfer circuitries DS and again converted to the voltages by the load circuitries LD. By setting high the control pulse $\phi_{CR0}$ to $V_{cc}$, one half of the transistors incorporated in the switch circuit SWR are turned on to allow the signal voltages to be inputted to the multiple-level sense circuits MLR. Voltages appearing across the load circuitries $LD_{11}$, $LD_{31}, \ldots, LD_{(q-1)1}$ are applied to the input terminals $N_{Ra}$ ($N_{Ra1}, \ldots, N_{Raq}$) as the reference signal voltages $V_{Ra}'$. By way of example, in the multiple-level sense circuitry $MLR_1$, the load circuitry $LD_{10}$ is connected to the input terminal $N_{S1}$, the load circuitry $LD_{01}$ is connected to the input terminal $N_{Rb1}$ and the load circuitry $LD_{11}$ is connected to the input terminal $N_{Ra1}$, while in the multiple-level sense circuit $MLR_2$, the load circuitry $LD_{20}$ is connected to the input terminal $NS_2$, $LD_{21}$ is connected to $N_{Rb2}$ and $LD_{11}$ to $N_{Ra2}$, wherein the voltage appearing across the load circuitry $LD_{11}$ is stored or utilized in common by both the multiple-level sense circuits $MLR_1$ and $MLR_2$ as the reference voltage $V_{Ra}'$. Parenthetically, the voltage appearing across the load circuitry $LD_{(q+1)0}$ is inputted to none of the multiple-level sense circuits. When the signal $V_S'$ is detected and data is determined by the multiple-level sense circuits MLR, the control pulses $\phi_R$ and $\phi_{CR0}$ are set low to 0 (volt) to thereby turn off the signal transfer circuitry DS and the switch SWR. The results of detection $Q_1$ ($Q_{1i}, \ldots, Q_{qi}$) are transmitted to the multiple-level supply circuit MLW, whereby one of four potential levels is outputted. The one potential level is then transmitted to the data lines $d_0$ via the signal transfer circuitries $DS_{10}, \ldots, DS_{q0}$. By lowering the potential on the word line $W_1$ to 0 (volt), the memory cells $MC_{11}, \ldots, MC_{1(q+1)}$ are restored. Simultaneously, the potential on the dummy word line $DW_2$ is also lowered. Subsequently, the control pulse $\phi_P$ is pulled up to $V_{cc}$ to thereby allow the precharge circuit PD to precharge the data lines to the voltage $V_P$. Further, by pulling up the control pulse $\phi_{DC2}$ to $V_{cc}$ as well, the potential $V_H$ or 0 (volt) is written in the dummy cells $DC_{20}, \ldots, DC_{2q}$. Parenthetically, the memory cell $MC_{1(q+1)}$ is restored to the fixed potential level inputted to the signal transfer circuitry $DS_{(q+1)0}$.

In the arrangement described above, the data lines disposed at both sides of these data lines onto which the data are read out from the memory cells are used as the dummy data lines. In other words, the intrinsic data lines are disposed, being sandwiched between a pair of dummy data lines. This arrangement is advantageous in that difference in the noise component between the data lines and the dummy data lines is negligible. Besides, since the dummy data line is shared by the intrinsic data lines disposed at both sides thereof, the memory cells can be arrayed in a manner similar to the folded data-line arrangement, whereby increase in the area can be suppressed to a minimum.

Because the dummy cell is additionally provided with the resetting transistor, the possibility that electric charge stored in the dummy cell leaks therefrom to incur erroneous data detection as pointed out hereinbefore in conjunction with the memory array shown in FIG. 16 can positively be excluded. It should however be noted that in the case of the memory array structure shown in FIG. 16, a dummy word line may be provided in addition to the word line, wherein the dummy cell can be disposed at the intersection or cross-point between the dummy word line and the dummy data line. In that case, memory cells for matching capacitance of the data line with that of the dummy data line are disposed at the intersections between the dummy word line and the intrinsic data line and between the latter and the dummy data line. The threshold voltage of the transistors constituting these balancing memory cells is set at a high level to prevent the transistors from being turned on.

According to the teachings of the invention incarnated in the illustrated embodiments, a high density array of the memory cells can be realized while assuring the memory read operation with a remarkably improved S/C ratio. Thus, it is possible to implement a semiconductor memory which can enjoy high S/N ratio and high integration density.

In a semiconductor multiple-level memory, a pair of dummy data lines having the dummy cells connected thereto are disposed in parallel with the intrinsic data lines to which the multiple-level sense circuit and the multiple-level supply circuit are connected, wherein the signals produced on the two dummy data lines by reading the dummy cells are multiplied with constants and the products resulting from the multiplications are added together in the multiple-level sense circuit to thereby generate the reference level for comparison. Through comparison of the signal read out onto the intrinsic data line from the memory cell with the reference level, it is determined to which of three or more levels the data stored in the memory cell corresponds (data detection or identification). In this way, influence of noise making appearance on the data line can be eliminated, whereby the data read operation can be carried out with a high S/N ratio without need for increasing the chip area.

What is claimed is:

1. A semiconductor memory, comprising:
    a plurality of word lines;
    a plurality of data lines disposed so as to intersect said plurality of word lines;
    memory cells each consisting of one transistor and one capacitor and disposed at given cross-points between said plurality or word lines and said plurality of data lines;
    a dummy data line provided in common to said plurality of data lines;
    a plurality of dummy cells disposed at given cross-points between said plurality of word lines and said dummy data line for generating a reference signal;
    signal converting means connected electrically to said plurality of data lines, respectively, and to said dummy data line; and
    differential signal detecting means provided for said plurality of data lines, respectively;
    wherein said signal converting means associated with each of said plurality of data lines has an output electrically connected to one of differential inputs of said differential signal detecting means, and
    wherein said signal converting means, associated with said dummy data line, has an output which is electrically connected to another of the differential inputs of said differential signal detecting means.

2. A semiconductor memory according to claim 1, wherein said dummy data line is interposed between two adjacent ones of said plurality of data lines.

3. A semiconductor memory according to claim 1,
    wherein said signal converting means comprises plural signal converting circuits provided for said plurality of data lines and said dummy data line, respectively, and
    wherein said differential signal detecting means comprises plural differential signal detecting circuits corresponding in number to the number of data lines in said plurality of data lines, each differential signal detecting circuit having a first input coupled to an output of a signal converting circuit and having a second input coupled to the output of that one of said plurality of signal converting circuits associated with said dummy data line.

4. A semiconductor memory according to claim 3, wherein the signal converting circuit provided for said dummy data line includes a pair of signal converters disposed at both ends of said dummy data line, respectively.

5. A semiconductor memory according to claim 1, wherein said signal converting means is comprised of a voltage-to-current converter circuit and a current-to-voltage converter circuit coupled thereto.

6. A semiconductor memory, comprising:
    a plurality of global data lines;
    a global dummy data line provided in common to said plurality of global data lines;
    first signal converting means connected to each of said plurality of global data lines;

second signal converting means connected to said global dummy data line;
differential signal detecting means provided at each of said plurality of global data lines;
a plurality of memory blocks, each memory block comprising:
a plurality of word lines,
a plurality of data lines disposed so as to intersect said plurality of word lines,
memory cells each including one transistor and one capacitor and disposed at given cross-points between said plurality of word lines and said plurality of data lines,
a dummy data line provided in common to said plurality of data lines,
a plurality of dummy cells disposed at given cross-points between said plurality of word lines and said dummy data line for generating a reference signal,
third signal converting means coupled to said plurality of data lines and said plurality of global data lines, and
fourth signal converting means connected to said dummy data line and said global dummy data line;
wherein said first signal converting means associated with each of said plurality of global data lines has an output electrically connected to one of differential inputs of said differential signal detecting means; and
wherein said second signal converting means has an output electrically connected to another of the differential inputs of said differential signal detecting means.

7. A semiconductor memory according to claim 6, wherein said global dummy line is interposed between the adjacent ones of said plurality of global data lines.

8. A semiconductor memory according to claim 6, wherein said global data lines are disposed in parallel and are arranged as first and second groups of global data lines, said first group of global data lines includes each one of alternating ones of the parallel disposed data lines and said second group of global data lines includes each one of alternating ones of data lines other than those included in said first group,
wherein each first signal converting circuit and differential signal sensing circuit associated with said first group of global data lines are provided at first ends of the data global lines of said first group, respectively, and
wherein each first signal converting circuit and differential signal sensing circuit associated with said second group of global data lines are provided at second ends of the global data lines of said second group, respectively, said second ends respectively correspond to ends on the global data lines, of both said first and second groups, opposing from that of said first ends thereof.

9. A semiconductor memory according to claim 8, wherein said second signal converting means provided for said global dummy data line includes a pair of signal converters disposed at both ends of said global dummy data line, respectively.

10. A semiconductor memory according to claim 1, wherein an electrode contacted to an impurity-doped region of a transistor constituting said memory cell is extended over said transistor and said data line to thereby constitute a capacitor of said memory cell in cooperation with an insulation film provided over said impurity-doped region and a conductive electrode provided on said impurity-doped region.

11. A semiconductor memory according to claim 3, wherein said plurality of data lines are disposed in parallel and are arranged as first and second groups of data lines, said first group of data lines includes each one of alternating ones of the parallel disposed data lines and said second group of data lines includes each one of alternating ones of data lines other than those included in said first group,
wherein each signal converting circuit and differential signal detecting circuit associated with said first group of data lines are provided at first ends of the data lines of said first group, respectively, and
wherein each signal converting circuit and differential signal detecting circuit associated with said second group of data lines are provided at second ends of the data lines of said second group, respectively, said second ends respectively correspond to ends on the data lines of both said first and second groups opposing from that of said first ends thereof.

12. A semiconductor memory according to claim 3, wherein each of said plurality of signal converting circuits is comprised of a series arrangement of a voltage-to-current converter and a current-to-voltage converter.

13. A semiconductor memory according to claim 6, wherein said first signal converting means comprises plural first signal converters provided for said global data lines, respectively,
wherein said second signal converting means comprises a second signal converter, and
wherein said differential signal signal detecting means comprises plural differential signal sensing circuits corresponding in number to the number of global data lines in said plurality of global data lines, each sensing circuit having a first input coupled to an output of a first signal converter and having a second input coupled to an output of said second signal converter.

14. A semiconductor memory, comprising:
a plurality of global data lines;
a global dummy data line provided in common to said plurality of global data lines;
first signal converting means connected to each of said plurality of global data lines;
second signal converting means connected to said global dummy data line;
differential signal detecting means provided at each of said plurality of global data lines;
a plurality of m emory blocks, each memory block comprising:
a plurality of word lines,
a plurality of data lines disposed so as to intersect said plurality of word lines,
memory cells each including one transistor and one capacitor and disposed at given cross-points between said plurality of word lines and said plurality of data lines,
a plurality of dummy data lines provided in common to said plurality of data lines,
a plurality of dummy cells disposed at given cross-points between said plurality of word lines and said plurality of dummy data lines for generating a reference signal, third signal converting means provided in common to individual groups of data lines, respectively, and connected to, a plurality of first switch means for connecting said third signal converting means to said plurality of data lines, fourth signal converting means provided in common to said plurality of dummy data lines and electrically connected to said global dummy data line, and second switch means for electrically connecting said fourth signal converting means to said plurality of dummy data lines;

wherein said first signal converting means associated with each of said plurality of global data lines has an output electrically connected to one of differential inputs of said differential signal detecting means, and wherein said second signal converting means has an output electrically connected to another of the differential inputs of said differential signal detecting means.

15. A semiconductor memory according to claim 14, wherein said first signal converting means comprises plural first signal converters provided for said global data lines, respectively, wherein said second signal converting means comprises a second signal converter, and wherein said differential signal detecting means comprises plural differential signal sensing circuits corresponding in number to the number of global data lines in said plurality of global data lines, each sensing circuit having a first input coupled to an output of a first signal converter and having a second input coupled to an output of said second signal converter.

16. A semiconductor memory according to claim 15, wherein said third signal converting means comprises plural third signal converters, commonly provided for said groups of data lines, respectively, and wherein said fourth signal converting means comprises a fourth signal converter.

17. A semiconductor memory according to claim 16, wherein said first and second signal converters are current-to-voltage converters, respectively, and wherein said third and fourth signal converters are voltage-to-current converters.

18. A semiconductor memory according to claim 8, wherein each said first signal converting circuit is a current-to-voltage converter.

19. A semiconductor memory according to claim 15, wherein said global data lines are disposed in parallel and are arranged as first and second groups of global data lines, said first group of global data lines includes each one of alternating ones of the parallel disposed global data lines and said second group of global data lines includes each one of alternating ones of global data lines other than those included in said first group, wherein each first signal converting circuit and differential signal sensing circuit associated with said first group of global data lines are provided at first ends of the data global lines of said first group, respectively, and wherein each first signal converting circuit and differential signal sensing circuit associated with said second group of global data lines are provided at second ends of the global data lines of said second group, respectively, said second ends respectively correspond to ends on the global data lines, of both said first and second groups, opposing from that of said first ends thereof.

* * * * *